US007273533B2

(12) United States Patent
Brcka et al.

(10) Patent No.: US 7,273,533 B2
(45) Date of Patent: Sep. 25, 2007

(54) PLASMA PROCESSING SYSTEM WITH LOCALLY-EFFICIENT INDUCTIVE PLASMA COUPLING

(75) Inventors: Jozef Brcka, Mesa, AZ (US); Rodney Lee Robison, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 270 days.

(21) Appl. No.: 10/717,268

(22) Filed: Nov. 19, 2003

(65) Prior Publication Data
US 2005/0103445 A1    May 19, 2005

(51) Int. Cl.
C23C 16/00 (2006.01)
C23F 1/00 (2006.01)
H01L 21/306 (2006.01)

(52) U.S. Cl. .............................. 156/345.48; 118/723 I; 156/345.43

(58) Field of Classification Search ................ 118/726, 118/723 I; 156/345.44, 345.48
See application file for complete search history.

(56) References Cited

U.S. PATENT DOCUMENTS

| | | | |
|---|---|---|---|
| 6,028,285 A | 2/2000 | Khater et al. | |
| 6,237,526 B1 * | 5/2001 | Brcka | 118/723 I |
| 6,268,700 B1 | 7/2001 | Holland et al. | |
| 6,273,022 B1 * | 8/2001 | Pu et al. | 118/723 I |
| 6,287,435 B1 * | 9/2001 | Drewery et al. | 204/298.09 |
| 6,338,313 B1 | 1/2002 | Chan | |
| 6,451,161 B1 | 9/2002 | Jeng et al. | |
| 6,474,258 B2 * | 11/2002 | Brcka | 118/723 I |
| 6,495,963 B1 | 12/2002 | Bennett | |
| 6,523,493 B1 | 2/2003 | Brcka | |
| 6,685,799 B2 * | 2/2004 | Hooshdaran et al. | 156/345.48 |
| 6,825,618 B2 * | 11/2004 | Pu et al. | 315/111.51 |
| 2001/0022157 A1 * | 9/2001 | Shin et al. | 118/723 I |
| 2001/0022158 A1 * | 9/2001 | Brcka | 118/723 I |
| 2002/0170677 A1 | 11/2002 | Tucker et al. | |
| 2003/0006009 A1 * | 1/2003 | Todorov et al. | 156/345.48 |

FOREIGN PATENT DOCUMENTS

EP    0 838 843 A2    4/1998

* cited by examiner

Primary Examiner—Parviz Hassanzadeh
Assistant Examiner—Rakesh K. Dhingra
(74) Attorney, Agent, or Firm—Wood, Herron & Evans, L.L.P.

(57) ABSTRACT

An inductively coupled plasma source is provided with a peripheral ionization source for producing a high-density plasma in a vacuum chamber for semiconductor wafer coating or etching. The source includes a segmented configuration having high and low radiation segments and produces a generally ring-shaped array of energy concentrations in the plasma around the periphery of the chamber. Energy is coupled from a segmented low inductance antenna through a dielectric window or array of windows and through a segmented shield or baffle. The antenna has concentrated conductor segments through which current flows in one or more small cross-section conductors to produce high magnetic fields that couple through the high-transparency shield segments into the chamber, while alternating distributed conductor segments, formed of large cross-section conductor portions or diverging small conductor sections, permit magnetic fields to pass through or between the conductors and deliver only weak fields, which are aligned with opaque shield sections and couple insignificant energy to the plasma. The source provides spatial control of plasma energy distribution, which aids in control of the uniformity of plasma processing across the surface of the semiconductor being processed.

11 Claims, 15 Drawing Sheets

PLASMA PROCESSING SYSTEM WITH LOCALLY-EFFICIENT INDUCTIVE PLASMA COUPLING

This invention relates to high-density plasma generating devices, systems and processes, particularly for the manufacture of semiconductor wafers. In particular, the invention relates to antenna and shield structure for the production of high-density inductively coupled plasmas (ICP) for such systems and processes.

BACKGROUND OF THE INVENTION

Gas plasma generation is widely used in a variety of integrated circuit (IC) fabrication processes, including plasma etching, plasma enhanced chemical vapor deposition (PECVD), and plasma sputter deposition applications. Generally, plasmas are produced within a process chamber by introducing a process gas at vacuum pressure into the chamber and then coupling electrical energy into the chamber to create and sustain a plasma in the process gas. The plasma may exist at various ionization fractions from $10^{-6}$ up to a fully ionized plasma.

The plasma generally contains positively charged ions of working gas that are used for etching a surface of a substrate, sputtering material from a target for depositing a layer of the material onto such a substrate and ions of vaporized coating material to control the deposition of the material onto the substrate by ionized physical vapor deposition (iPVD). The plasma typically contains electrons equivalent in number to the positive charges in the plasma so that the plasma is macroscopically quasi-neutral.

Various ways of producing a plasma within a process chamber are used. Opposed electrodes can be oriented within the chamber to capacitively couple energy to the plasma. Microwave energy and electron cyclotron resonance (ECR) devices are also used. Inductive coupling of energy to the plasma is particularly desirable for producing a high-density plasma, particularly plasmas having a high-ionization fraction with a relatively low electron energy or plasma potential. Inductively coupled plasmas (ICP) often use a coil or antenna, shaped and positioned with respect to the processing chamber to inductively couple energy into the processing chamber and thus create and sustain a plasma therein.

In some ICP systems, an inductive coil or antenna is positioned around or proximate the top portion or another end of the chamber to create a plasma within the chamber. Such an antenna is positioned on one side of a dielectric plate or window in the wall of the processing chamber, and electromagnetic energy from the antenna is coupled through the dielectric window and into the plasma. One suitable dielectric material for a window or chamber sidewall is quartz.

The geometry of an ICP system is a factor in determining both plasma density and uniformity, which, in turn, can affect the processing uniformity over the area of the substrate. It has often been regarded as desirable to produce a uniform, high-density plasma over a significantly large area so that large substrate sizes can be accommodated. Ultra large-scale integrated (ULSI) circuits, for example, are presently formed on wafer substrates having diameters of 200 mm and 300 mm.

In conventional sputter coating systems of the prior art, it has been recognized that the geometry of sputtering targets affected the uniformity of coatings on wafers. In U.S. Pat. No. 4,957,605, for example, it was determined that increasing material supplied from an annular ring toward the outer periphery of the target improved uniformity of coating on the wafer and improved step coverage. This patent discussed processes performed at such pressures that left line-of-sight paths for sputtered material to travel from target to wafer.

When ionized physical vapor deposition systems (iPVD) were developed, such as in U.S. Pat. No. 6,080,287, ring-shaped targets were found advantageous. An RF source in the center of the target was provided to couple energy to form a secondary plasma in the chamber that ionized material sputtered from the target. The ionized coating material aids in the coating of features on wafers as such features have become smaller. It was further found that the use of higher pressures in the chambers had advantages, as in U.S. Pat. No. 6,287,435. Such higher pressures tended to thermalize sputtered material in the chamber and masked the effects of target geometry on coating uniformity.

In etching systems and processes, pressures are usually not as high as in the high pressure iPVD systems discussed above, but because no target geometry is available, etching systems that use ICP must rely on the shape of the plasma to provide coating uniformity. In coating and etching, as well as plasma cleaning and other plasma processing systems, there remains an ongoing need for increased uniformity in the processing of wafers.

The most common inductively coupled sources have antennas in the form of coils with planar, cylindrical or dome-shaped geometry. Other coil structure includes more complex shapes having combined (hybrid) or dual coil configurations, multiple small solenoids, multiple spirals, multizone ICP enhanced PVD, torroids, transmission lines, embedded coils, planar helicon (serpentine) antennas, and parallel conductor antennas. Three-dimensional coils, and deposition baffles and Faraday shields proposed to be used with them, have been described by the present applicant in U.S. Pat. Nos. 6,237,526 and 6,474,258, and in U.S. patent application Ser. Nos. 10/080,496 and 10/338,771.

The semiconductor manufacturing tools for 300 mm wafers are becoming of increase demand, which call for larger processing chambers, typically more than 450 mm in diameter. Such chamber enlargement is needed to reduce plasma losses within the processing zone by reducing the effect of the chamber walls on the bulk plasma, and to accommodate inside the chamber hardware such as shields, lamps, diagnostic devices, monitoring and control instrumentation, that are becoming increasingly required. For such chambers, the inductive elements are made larger as well, in a range of from 400 to 500 mm diameter for cylindrical or solenoid coils and up to 350 mm for spiral antennas used to inductively couple energy into the chambers for the processing of 300 mm wafer.

Increased coil size has required larger dielectric windows to allow RF energy to penetrate into plasma efficiently and to withstand atmospheric forces. Scaling up an external antenna for large area plasma in a conventional inductively coupled discharge meets such difficulties as requiring a thick dielectric window, a large inductance of antenna, and an enormous increase in power required to provide identical plasma conditions for etching or deposition. For example, inductance of the antenna is proportional to the square of the number of turns, and voltage drop across the antenna increases with number of turns. The voltage at the ends of such large scaled antennas can easily reach values above 10 kV at typical coil currents at the industrial frequency of 13.56 MHz. Such a high voltage is a hazard and results in an intense capacitive coupling between the antenna and the plasma, and an increased potential for sparking and arcing.

Etch uniformity at the wafer is given by ion flux towards the wafer and it is determined by plasma density distribution. Typically, an ICP source with a spiral coil produces a plasma distribution with a peak at its center. Use of solenoids with larger diameters is limited due to induced high voltages at such coils. The geometry of an inductively coupled plasma source, specifically of the antenna, is a significant factor in determining both the plasma and processing uniformity over a large area. With ICP sources, plasma is excited by heating electrons in the plasma region near the vacuum side of the dielectric window by oscillating inductive fields produced by the antenna and coupled through the dielectric window. Inductive currents, which heat the plasma electrons, are derived from RF magnetic fields produced by RF currents in antenna. The spatial distribution of the magnetic field is a function of the sum of the fields produced by each portion of the antenna conductor. The geometry of the inductive antenna can in large part determine spatial distribution of the plasma ion density within the reactor chamber.

In some cases, a shield that is transparent to the inductive component of the electromagnetic field is used to suppress the capacitive coupling from antenna to plasma and to prevent a conductive or contaminating layer from building up on the dielectric window. The geometry and structure of such a shield can have an effect on the spatial distribution of plasma inside the chamber as well.

SUMMARY OF THE INVENTION

An objective of the present invention is to improve the plasma processing uniformity on semiconductor wafers, particularly in applications involving etching or higher pressure coating processes.

A more particular objective of the present invention is to provide a plasma source for utilization in the plasma processing of large area substrates, including by processes of plasma etching, plasma deposition and plasma cleaning.

Another objective of the invention is to provide a low inductance inductive device.

An additional objective of the invention is to provide a highly effective and simplified plasma source and reduced chamber cost. A more particular objective of the invention is to provide a reduced cost of ownership of ICP plasma processing equipment, and particularly to provide an ICP source that is economically and relatively easily manufactured and maintained.

In accordance with the principles of the present invention, an active peripheral ionization source is provided for use in producing a plasma density that yields uniform plasma processing for semiconductor wafers, particularly for large wafers such as 300 mm wafers. Further in accordance with the present invention, an ICP source is provided with a low inductance inductive radiating device in the form of an antenna or coil for coupling energy into the vacuum plasma processing chamber.

In various embodiments of the invention, an ICP source is provided with a segmented antenna having locally differing parameters and providing a generally lowered impedance. The antenna is configured to produce enhanced peripheral ionization. Typically, such ionization produces a generally ring-shaped plasma which compensates for the overall chamber and source geometry so as to produce a uniform effective plasma at the surface of the wafer for processing the wafer. The ring-shaped plasma is, in many embodiments, in the form of an annular array of alternating high and low power concentration regions around the periphery of the chamber.

In accordance with various embodiments of the invention, deposition and etching machines for semiconductor wafer processing are provided with an ICP source having multiple sections, providing dual performance. Certain portions of the source are provided with shield sections having high-transparency to the RF magnetic field from adjacent sections of an antenna that are configured to deliver maximum power into the plasma. These portions of the source are arranged in a ring in a peripheral area of the chamber and operate in the most effective mode of energy conversion for coupling power into the plasma. Other portions of the source are provided with shield sections that are opaque to the RF magnetic field from adjacent sections of the antenna that are configured to operate at low efficiency to reduce the amount of power delivered to adjacent hardware. In these portions of the source, the antenna is shielded from the plasma by the opaque shield sections, which also provide complete shielding of the dielectric wall against contamination from the plasma.

In its preferred embodiments, such a device is provided with a single inductive element instead of spatially distributed multiple inductive coils.

In certain embodiments of the invention, dielectric window size and thickness are reduced to increase ICP efficiency. ICP efficiency may also be reduced in locations where it is not required to deposit high RF power into plasma.

In particular embodiments of the invention, an antenna is provided with sections that differ in current carrying cross-section. The provision of such a cross-section that differs from one section to another concentrates the antenna current in one section and spreads it in another, thereby producing respectively higher and lower radiation or antenna efficiency from one such section to the other.

In certain embodiments, a spiral or annular 3-D antenna has a conductor element that defines angular portions, in some of which the conductors are spatially concentrated while in others the conductors are spatially distributed, producing respectively higher and lower radiation or coupling efficiency of RF energy from such portions. In many embodiments, closely-grouped tubular conductor segments form the spatially concentrated segments while spread-out or divergent conductor segments, or large surface-area segments, form the spatially distributed segments.

In some embodiments, an antenna is provided with a continuous conductor having differing cross-section segments that define different angular portions around the center of the chamber. In some such portions, the conductor has a large physical cross-section that presents an extended current-carrying surface from which weaker magnetic flux radiates than in portions having small physical cross-sections, which present a smaller current-carrying surface from which the radiation of magnetic flux is stronger.

The embodiments having the varying cross-section conductors and those having the single cross-section conductor present highly concentrated currents in the high-efficiency sections and spatially distributed currents in the low-efficiency sections.

A deposition baffle or shield may be provided with the antenna that is electromagnetically opaque in portions that coincide with the low-efficiency portions of the antenna, or segmented windows may be provided in the chamber wall that so coincide.

Serial connection of multiple conductor sectors can be arranged in different patterns, so common high magnetic flux channels are created by multiple sectors with small conductive cross-section, and low flux channels, are created by sectors with large conductive cross-section. To excite and sustain plasma effectively, small conductive cross-section sectors may be positioned next to the dielectric window that separates the vacuum from atmosphere.

Localization of the inductive coupling brings valuable benefits in plasma source design and its performance. Sector efficiently coupled to the plasma by inductive coupling from small conductive cross-section sectors can be by design positioned in a place required to produce plasma processing uniformity, localized plasma sustaining or ignition, power distribution, etc. Effective RF power delivery into some areas may be provided while power delivery may be reduced or eliminated in other areas. Due to localized inductive coupling efficiency, the RF transparent dielectric window need not extend over the full face of the inductive element, but only over areas where effective coupling need occur. Smaller dielectric windows can be used, which may be much thinner since they need to withstand significantly smaller atmospheric forces than in the case of single large-scale windows. Even large dielectric windows can be made of thinner material because they can be supported by rigid structure of the shields where very low inductive coupling between inductive element and plasma occurs. The total inductance of a segmented antenna will be lower than with a non-segmented coil. Inductance can be adjusted to a particular value by choosing appropriate ratios and geometries for the different sectors.

Advantages of certain embodiments of the invention are that existing RF source hardware of many existing plasma processing systems can be reduced in size and power levels, or even reduced to single antenna which is integrated with substrate holder plasma source, that will be sufficient to provide plasma to process wafers placed on the holder. Efficiency can be provided by thus generating plasma in the vicinity of the wafer where it affects immediately the plasma distribution above the wafer and not require oversized RF power supplies.

Embodiments of the present invention provide advantages that include greatly increasing, for example doubling, the lifetime of the dielectric wall or window of the chamber, which may be rotated or otherwise shifted to move the localized areas of deposition across the wall or window. Only certain portions of a bell jar, for example, would be directly exposed to plasma and contamination where a shield is segmented into sections of differing opacity.

Deposition shields provided with the invention typically have reduced ohmic losses. Antennas provide reliable plasma ignition. The antennas allow the use of partially opaque deposition shields without loss of power due to reduced inductive coupling. Increased RF power coupling into plasma occurs in pre-selected locations, which can be provided and tailored by inductive element design, such as by optimizing the pitch or ratio between low and high-transmission areas of the deposition shield. Intense RF magnetic fields are generated locally, increasing power coupling into plasma, through short slots in a deposition shield.

These and other objectives and advantages of the present invention will be more readily apparent from the following detailed description.

DETAILED DESCRIPTION

Figure 1:
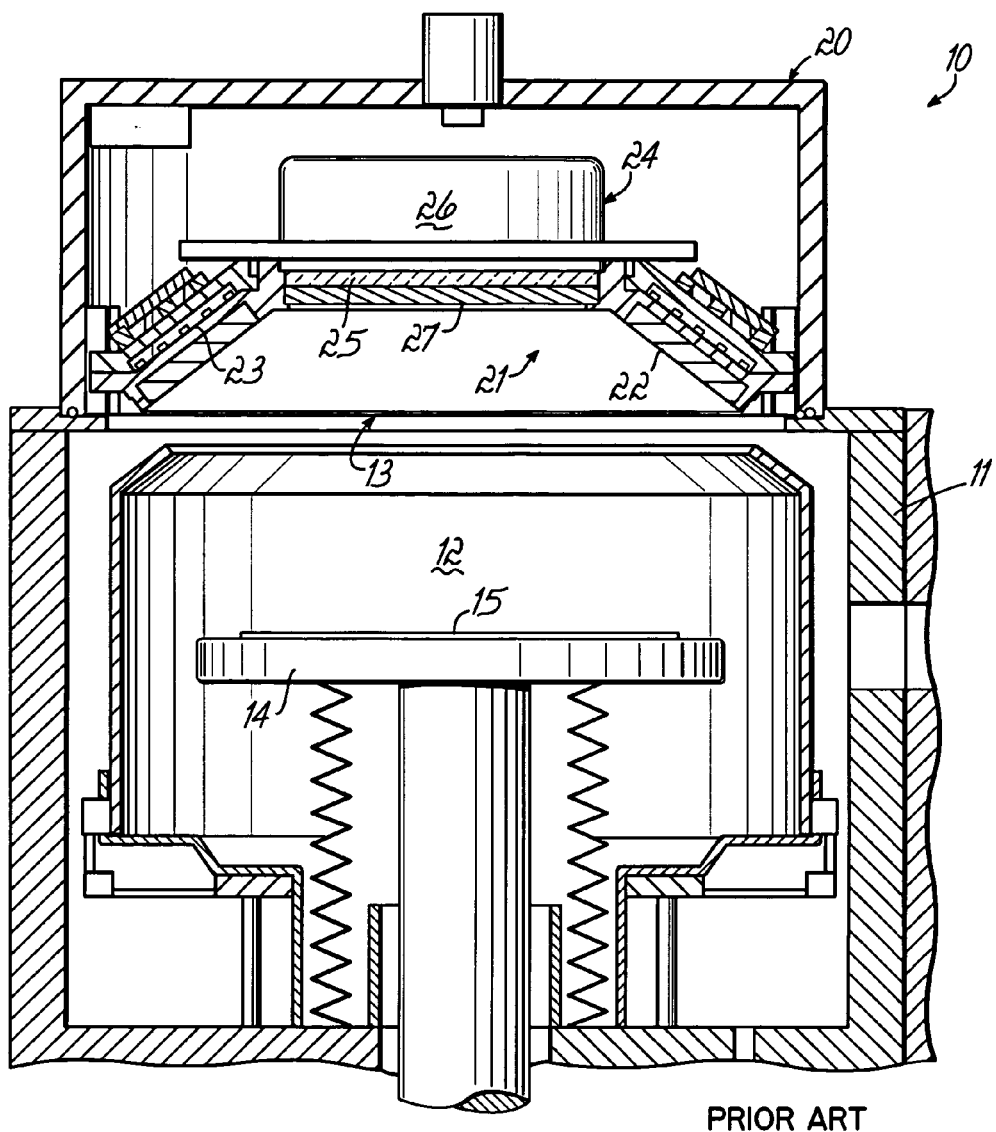
FIG. 1 is a simplified diagram of a prior art ionized physical vapor deposition apparatus of one type to which certain embodiments of the present invention can be applied.

The ICP source of the present invention can be used in various plasma processing systems, such as those for performing sputter etching and deposition processes, plasma-enhanced CVD (PECVD) processes, ionized PVD (iPVD)

processes, and reactive ion etching processes (RIE). FIG. 1 illustrates an iPVD apparatus 10 of a type for the manufacture of semiconductor wafers in which embodiments of the invention are described below. Examples of semiconductor wafer processing machines of the iPVD type are described in U.S. Pat. Nos. 6,080,287 and 6,287,435, both hereby expressly incorporated by reference herein.

The iPVD apparatus 10 includes a vacuum processing chamber 12 enclosed in a chamber wall 11 having an opening 13 at the top thereof in which is mounted an ionized sputtering material source 20, which seals the opening 13 to isolate the vacuum within the chamber 12 from external ambient atmosphere. Within the chamber 12 is a wafer support 14 that holds a semiconductor wafer 15 with a side thereof to be processed facing the opening 13. The ionized material source 20 includes a magnetron cathode assembly 21 that includes an annular target 22, which is the source of the coating material, typically but not necessarily a metal. The cathode assembly also includes a power supply (not shown) for applying a negative DC sputtering potential to the target 22 and a permanent magnet assembly 23 situated behind the target 22, which traps electrons energized by the DC potential over the surface of the target 22 to form a primary plasma that produces ions in the gas within the chamber to sputter material from the target 22.

In the source 20, the target 22 is annular and surrounds a dielectric window 25, typically formed of quartz or alumina, that is sealed to the target 22 at its center. The target 22 and the window 25 form part of a vacuum enclosure for the chamber 12 along with the chamber wall 11. An RF ICP source 24 is situated at the window 25 and couples RF energy into the chamber 12 to energize a secondary high-density inductively coupled plasma within the chamber 12. The RF ICP source 24 includes an antenna or coil 26 situated on the atmospheric side of the window 25 and a deposition baffle or shield 27 that covers the window 25 on the inside of the chamber 12. An RF generator (not shown) is connected across the leads of the antenna 26 through a suitable matching network. Typically, the RF generator operates at the industrial frequency of 13.56 MHz. Pressures in the chamber 12 for iPVD usually fall in the range from 10 mTorr to 150 mTorr.

The antenna 26 and the shield 27 are designed together to most effectively inductively couple RF energy from the antenna 26 into the chamber 12 through the window 25 and shield 27, with low capacitive coupling from the antenna 26 into the chamber 12 that would impose a voltage on the plasma. The shield 27 is further configured to protect the window 25 from accumulated deposition, which, where the coating material is metal in particular, renders the window 25 opaque to radiation from the antenna, and interferes with the coupling of energy into the plasma. Details of antennas and the accompanying shields are described in U.S. Pat. Nos. 6,237,526 and 6,474,258, and U.S. patent application Ser. Nos. 10/080,496 and 10/338,771, all hereby expressly incorporated by reference herein.

Figure 1A:
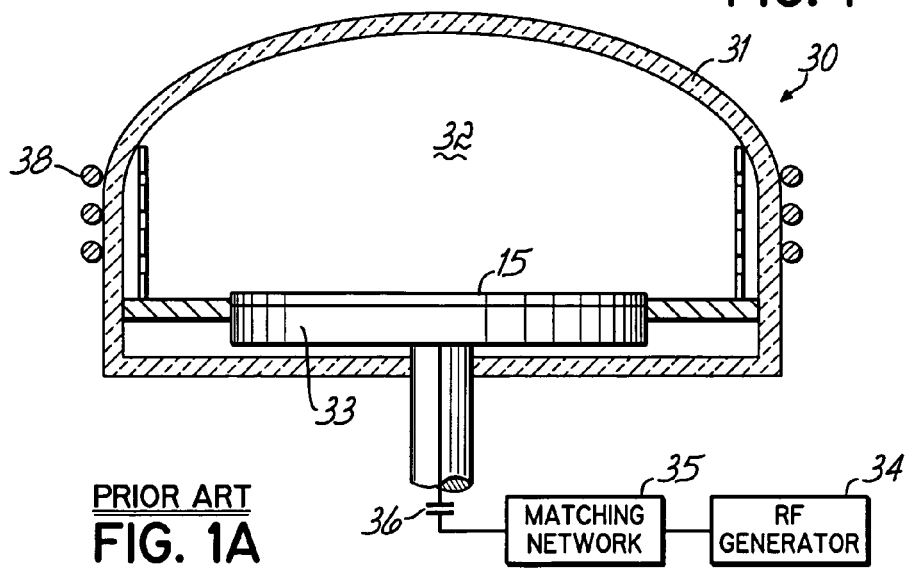
FIG. 1A is a simplified diagram of a prior art plasma etch or plasma cleaning apparatus of one type to which other embodiments of the present invention can be applied.

FIG. 1A illustrates an etch module, in particular an ICP sputter-clean process module 30, to which principles of the present invention can be applied. The module 30 has a vacuum processing chamber 32 enclosed therein by a chamber wall 31, illustrated as a quartz bell jar. Etch modules having metal-walled chambers with limited dielectric windows therein are also used for etch purposes and may also benefit from principles of the invention, as, for example, described in U.S. patent application Ser. No. 09/875,339, hereby expressly incorporated by reference herein. In the chamber 32, wafer 15 to be processed is supported on an RF biased substrate holder 33, to which it may be held by mechanical clamps, electrostatic chucks or other clamping structure (not shown). RF power is typically biased capacitively to the substrate holder 33 from an RF generator 34 through a matching network 35, and typically also through a capacitor 36.

When RF power is applied, a plasma is generated in the vacuum chamber 32, which typically is filled with an inert gas such as Argon, usually at pressures of from 0.1 to 10 mTorr. The substrate support 33 is generally biased negatively so that positive ions are accelerated towards the substrate 15 with energy sufficient to sputter etch materials from the surface of the wafer 15. Sputter etch rate depends on the energy and ion flux density. Energy is determined by the potential difference between plasma and substrate 15 on the substrate holder 33. Ion flux is determined by bulk plasma density. To increase ion flux towards the surface of the substrate 15, RF energy may be coupled into the chamber 32 by an antenna or coil 38 to form a high-density ICP in the chamber 32.

High-density inductively coupled plasmas have produced processing effects that are greater at the center of the wafers 15 than toward the wafer edges. Applicant has proposed to improve uniformity with a ring-shaped plasma in U.S. Pat. No. 6,523,493, hereby expressly incorporated by reference herein. In that patent, the use of a permanent magnet to shape the plasma was proposed. With the present invention, shaping of a plasma is provided by use of a locally-efficient RF ICP source. Such a source uses, for example, a series or arrangement of locally-efficient plasma generation, for example, by generating concentrations of plasma energy in a ring within the vacuum processing chamber. In the described embodiments, this local coupling efficiency is achieved by various embodiments of locally-efficient antenna structure, locally transparent shield structure, and combinations of antenna and shield structure. The shaped plasma is achieved in certain of the described embodiments by providing such locally-efficient structure in a peripheral ionization source in semiconductor wafer etching and coating processes and systems.

Figure 2:
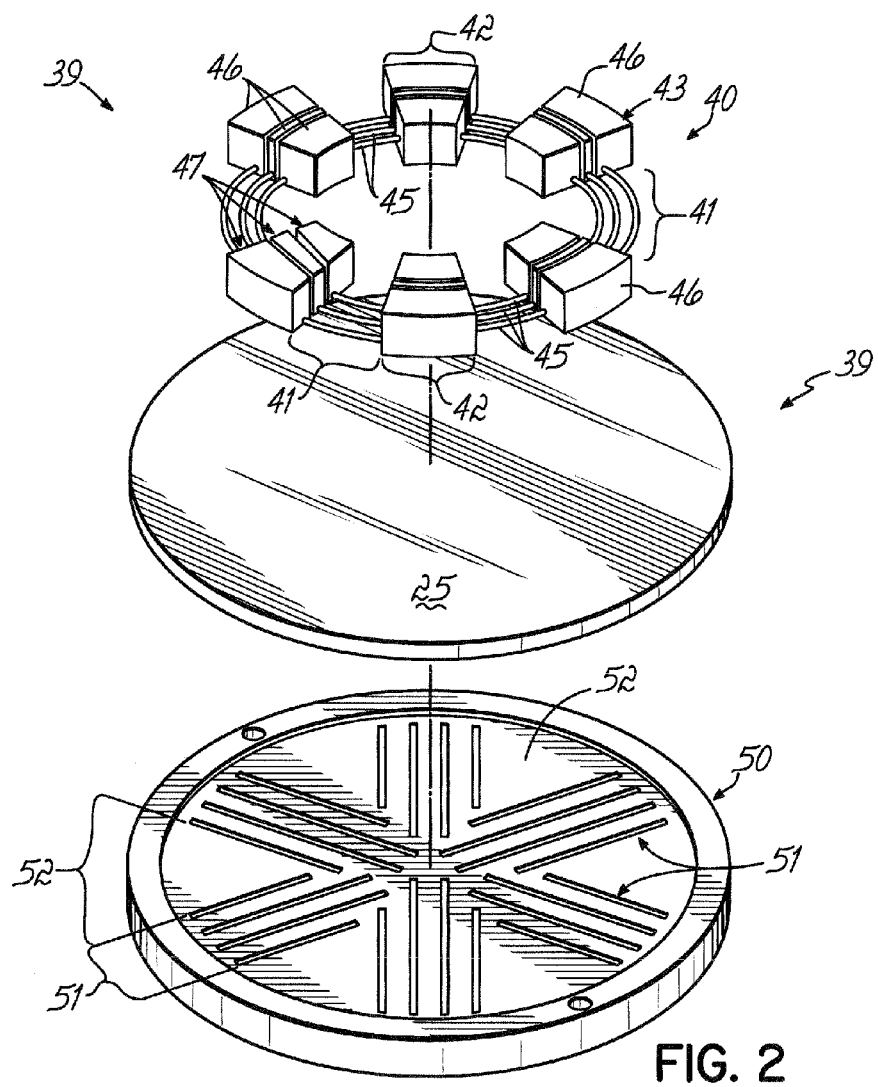
FIG. 2 is an expanded perspective view of a peripheral ionization ICP source according to certain embodiments of the present invention.

FIG. 2 illustrates an embodiment of a peripheral ionization source 39 embodying principles of the present invention. The peripheral ionization source 39 includes a segmented antenna 40 and preferably also a deposition baffle or shield 50, which may be installed in an ICP processing machine, aligned with each other on opposite sides of a dielectric section of, or window 25 in, the vacuum chamber wall of the apparatus. The antenna 40 is located in an atmospheric pressure environment outside of the window 25 while the baffle 50 is located in the vacuum chamber inside of the window 25. The antenna 40 is formed of one or more windings of a conductor 43 having high-efficiency, relatively high-inductance sections 41 alternating with low-efficiency, relatively low-inductance sections 42. The baffle 50, when employed, is formed of relatively transparent areas 51 alternating with relatively opaque areas 52. Installed in the processing apparatus, the high-efficiency sections 41 of the antenna 40 align with the high-transparency sections 51 of the baffle 50 while the low-efficiency sections 42 of the antenna 40 align with the low-transparency sections 52 of the baffle 50.

Figure 2E:
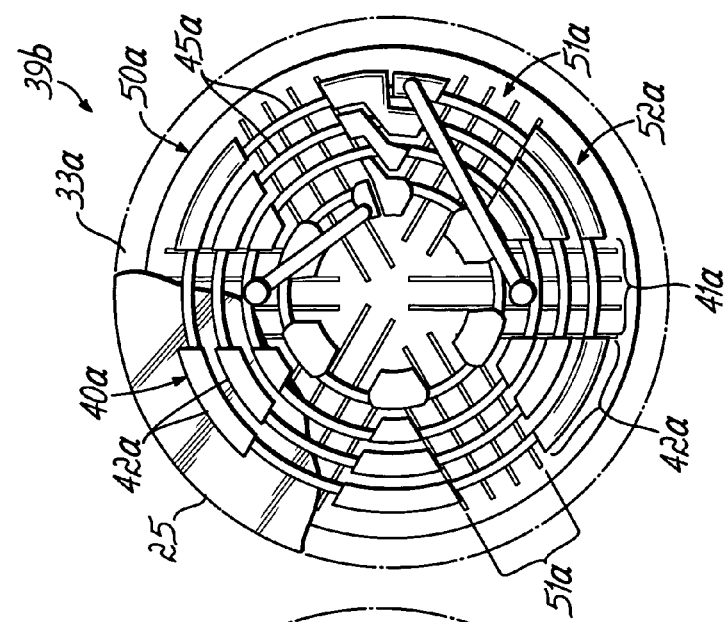
FIG. 2E is a top diagrammatic view of an ICP source for an iPVD apparatus of the type illustrated in FIG. 1 according to another embodiment of the present invention.
Figure 2C:
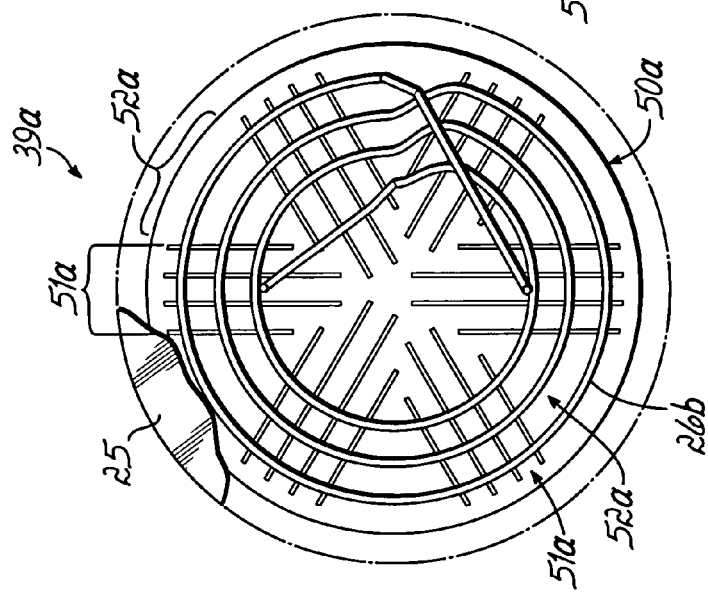
FIG. 2C is a top diagrammatic view of an ICP source for an iPVD apparatus of the type illustrated in FIG. 1 according to one embodiment of the present invention.
Figure 2A:
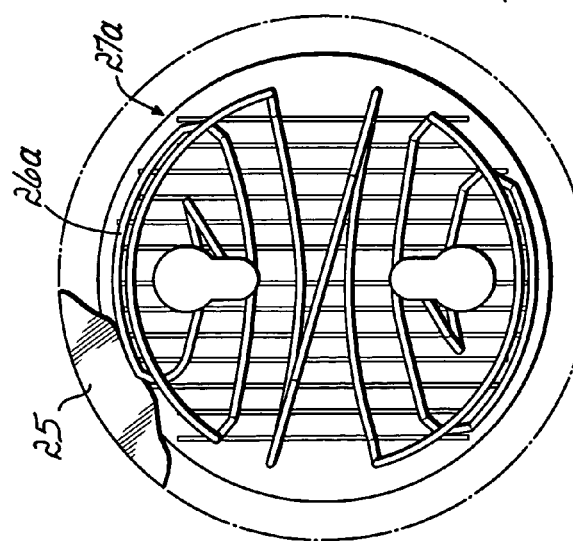
FIG. 2A is a top diagrammatic view of a prior art ICP source for an iPVD apparatus of the type illustrated in FIG. 1.
Figure 2B:
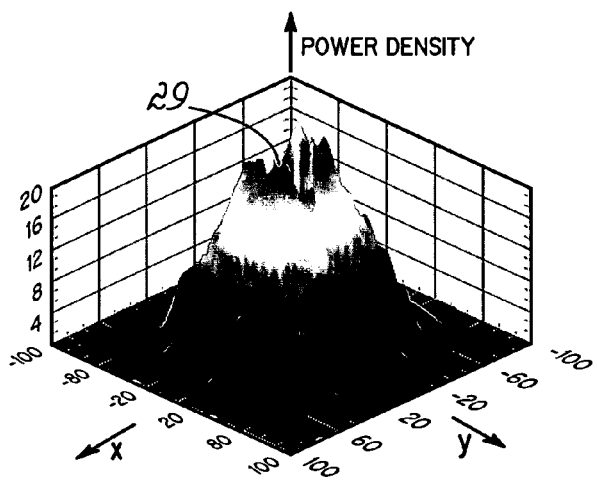
FIG. 2B is a three-dimensional graph of plasma power distribution produced by the source of FIG. 2A.

FIG. 2A is a top view of one embodiment of a three-dimensional coil 26a of a type described in U.S. Pat. No. 6,474,258 for use in an iPVD apparatus of the type described in U.S. Pat. No. 6,287,435 and depicted by the diagram of FIG. 1. Also illustrated is one embodiment of a deposition baffle 27a, also as described in those patents. The intervening window 25 is omitted. FIG. 2B is a graph illustrating power density 29 deposited from the antenna 26a into the chamber 12 immediately below the deposition baffle 27a. The power density tends to be greater toward the centerline of the chamber 12 and wafer 15. This is one representation of the prior art.

Figure 2D:
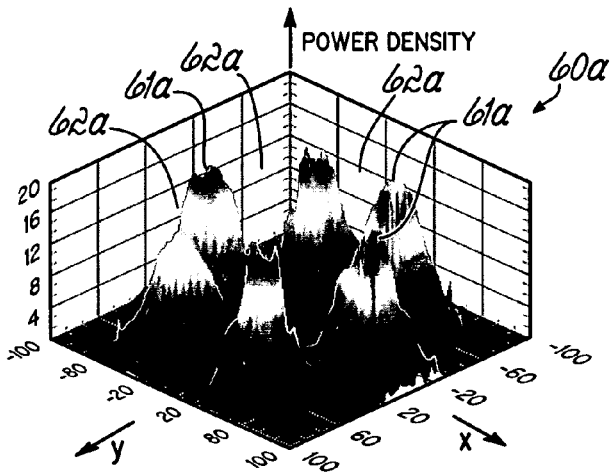
FIG. 2D is a three-dimensional graph of plasma power distribution produced by the source of FIG. 2C.

According to one aspect of the present invention, a segmented peripheral ionization source 39a is formed by providing a segmented deposition baffle 50a in combination with a spiral coil 26b, as illustrated in FIG. 2C. The baffle 50a has six relatively RF-transparent sections 51a alternating with six relatively RF-opaque sections 52a distributed in a circle around the centerline of the chamber and of the coil 26b. As a result, a plasma density distribution 60a is provided with six localized regions 61a of high-density plasma formation opposite the transparent sections 51a from the coil 26b, where the coupling is locally-efficient, as illustrated in the graph of FIG. 2D. Regions 62a between the six regions 61a are adjacent the opaque sections 52a where coupling through the baffle 50a is inefficient.

Figure 2F:
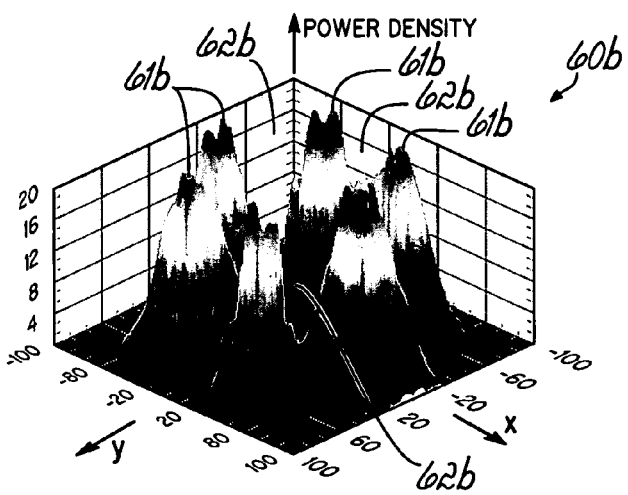
FIG. 2F is a three-dimensional graph of plasma power distribution produced by the source of FIG. 2E.

According to another aspect of the invention, a segmented antenna 40a is provided, which is illustrated in FIG. 2E in combination with the segmented baffle 50a, forming a peripheral ionization source 39b similar to the embodiment illustrated in FIG. 2. The segmented antenna 40a provides an advantageously reduced impedance when compared to the embodiment 39a having the coil 26b. The antenna 40a has six relatively high-inductance sections 41a, from which field production is relatively efficient, alternating with six relatively low-inductance sections 42a, from which field production is inefficient, distributed in a circle around the centerline of the chamber 12. The segmented antenna 40a may be used in combination with a baffle, for example the baffle 50a, with the transparent sections 51a thereof aligning with the relatively high-inductance sections 41a of the antenna 40a and the opaque sections 52a of the baffle 50a aligning with the relatively low-inductance sections 42a of the antenna 40a. As a result, a plasma density distribution 60b is provided with six localized regions 61b of high-density plasma formation opposite the transparent sections 51a from the antenna sections 41a, where the field production and coupling are locally-efficient, as illustrated in the graph of FIG. 2F. Regions 62b between the six regions 61b are opposite the opaque sections 52a from the antenna sections 42a where field production by the antenna 40a and the coupling through the baffle 50a are inefficient.

Figure 4:
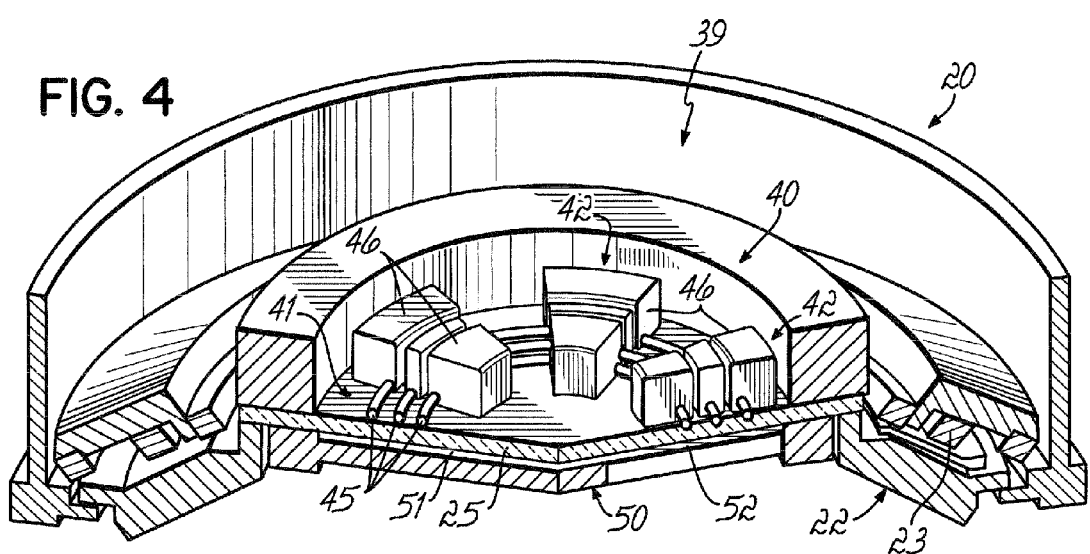
FIG. 4 is a cut-away perspective view of a cathode assembly for an iPVD apparatus having an ICP source according to one embodiment of the present invention.

In accordance with the preferred embodiment of the present invention as best shown in FIG. 4, high-density inductively coupled plasmas (ICP) for semiconductor coating and etching systems and processes is generated and maintained by a shaped peripheral inductive element that allows spatial distribution of the RF power into the plasma at locally enhanced ICP efficiency. The peripheral inductive element includes either or both of an antenna 40 and shield structure 50. For purposes of discussion, the antenna 40 refers to any of the various embodiments, illustrated or otherwise, such as antenna 40a (FIG. 2E), and the shield structure 50 refers to any of the various embodiments, illustrated or otherwise, such as baffle 50a (FIG. 2C). Similar references are made to sections 41, 42, 51 and 52 of this structure and to plasma distribution 60a, 60b and the features 61a, 61b and 62a, 62b thereof.

A feature of the segmented antenna element 40 is that its total inductance is lower than for a non-segmented antenna, such as antenna 26a or 26b, thereby making it technically more suitable for large area plasma processing systems, such as for 300 mm wafers 15, while maintaining the simplicity typical of smaller size ICP sources. The segmented antenna 40 is provided with an azimuthally modulated pitch that provides a spatial distribution of the rf power deposited into plasma, reduced ohmic losses in the deposition shield 50, low-inductance, and locally enhanced RF power density distribution 60a, 60b into plasma. The spatial RF power density distribution 60a, 60b allows for the design of a deposition shield 50 with enhanced shielding performance.

Figure 3:
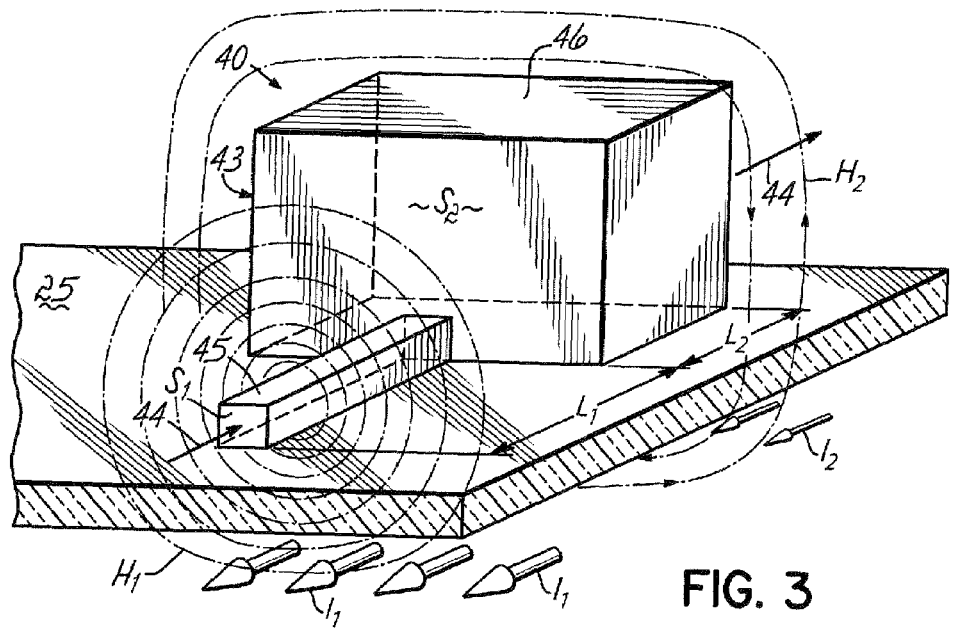
FIG. 3 is a perspective diagram of a section of an antenna conductor for the ICP source of FIG. 2E.
Figure 3A:
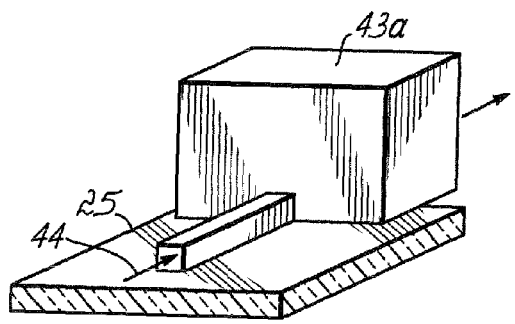
FIGS. 3A-3E are perspective diagrams of alternative embodiments of the conductor of FIG. 3.
Figure 3B:
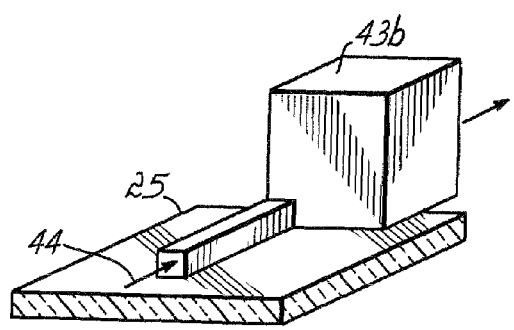
Figure 3C:
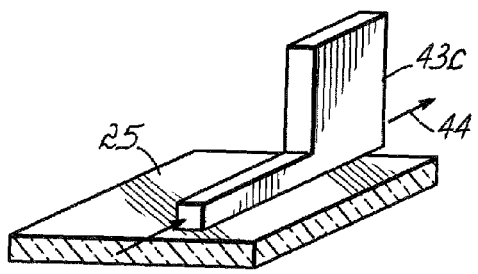
Figure 3D:
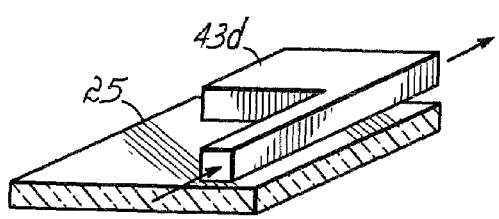
Figure 3E:
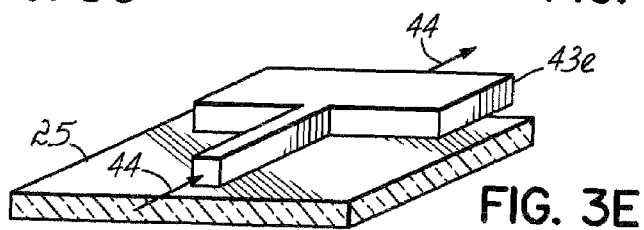

Design of the conductors of the segmented antenna or antennas 40 may be understood by reference to FIG. 3. An antenna 40 may be formed of a serial conductor 43, through which current may be considered as instantaneously flowing in a direction indicated by arrows 44, that consists of the serial connection of two sizes of conductors or conductor sectors 45 and 46, each with respectively different cross-sections $S_1$ and $S_2$ in a direction perpendicular to the current flow 44. Each of the different cross-section conductor sectors 45 and 46 has a length defined as $L_1$ and $L_2$, respectively, in a direction parallel to the current flow 44. Accordingly, the conductor 43 may be described as having a "filling factor", $\Phi$, which is defined as a ratio of a conductor length $L_2$, related to a large cross-section portion 46 to a total conductor length $L_1$ and $L_2$, (sum of conductor lengths both for small and large cross-section portions 45 and 46), e.g. $\Phi=L_2/(L_1+L_2)$. The conductor may also be defined in part by the "cross-section ratio", $\Theta$, as the ratio of the cross-sectional area $S_2$ of the large cross-section segment 46 to the area $S_1$ of the small cross-section segment 45, or $\Theta=S_2/S_1$.

A constant RF current flows through the conductor 43. At the RF frequencies used, this current flows close to the surface of the conductor 43 in the manner that it would flow through a cage of wires surrounding a space of the solid conductor's cross-section. In the case of the smaller cross-section segment 45, the surface current density is significantly higher than in the case of the larger cross-section segment 46. Consequently, the induced RF magnetic fields $H_1$ are stronger in the immediate vicinity of the surface of conductor segment 45 than the fields $H_2$ in the vicinity of the surface of conductor 46, and thus stronger inductive coupling will occur, and larger currents $I_1$ will be induced, within the plasma adjacent conductor segment 45 than currents $I_2$ induced into adjacent segment 46. RF power 61b, 61a coupled into the plasma adjacent segments 45 will in turn be larger than the RF power 62a, 62b coupled adjacent segments 46 (FIG. 2O and 2F).

Since inductive coupling to the plasma has threshold in RF power below which only capacitive coupling can occur, the low RF power 62 in the region of the large cross-section conductor sector 46 can be such that the ICP mode of coupling is impossible, where the power in the region adjacent the low cross-section sector 45 is still above the ICP threshold level. As a result, coupling of power is concentrated into regions 61a, 61b and substantially absent from regions 62a, 62b.

Various configurations 43a-43e of the segmented conductors 43 are illustrated in FIGS. 3A-3E. Each of these shows a different cross-sectional area configuration, some more effective than others. Generally, three-dimensional distributions such as 43a and 43b are more effective, with a dimension extending perpendicular to or away from the window 25, as 43c, being more effective than parallel to the window as 43d or 43e. Instead of segments of differing cross-section, conductor bundles can be made to converge and diverge, as explained more fully below.

FIG. 4 is a cut-away perspective view of the material source 20 of FIG. 1 equipped with a peripheral inductive element for generating ICP in accordance with an embodiment of the invention. The element includes a three-dimensional segmented antenna 40 on the outside of a planar window 25 with a correspondingly segmented deposition baffle or shield 50 protecting the inside of the window 25. Such an element may be that, for example, illustrated in FIG. 2E, producing a plasma power distribution as illustrated in FIG. 2D, which is illustrated in more detail as element 40a in FIG. 4A.

Figure 4A:
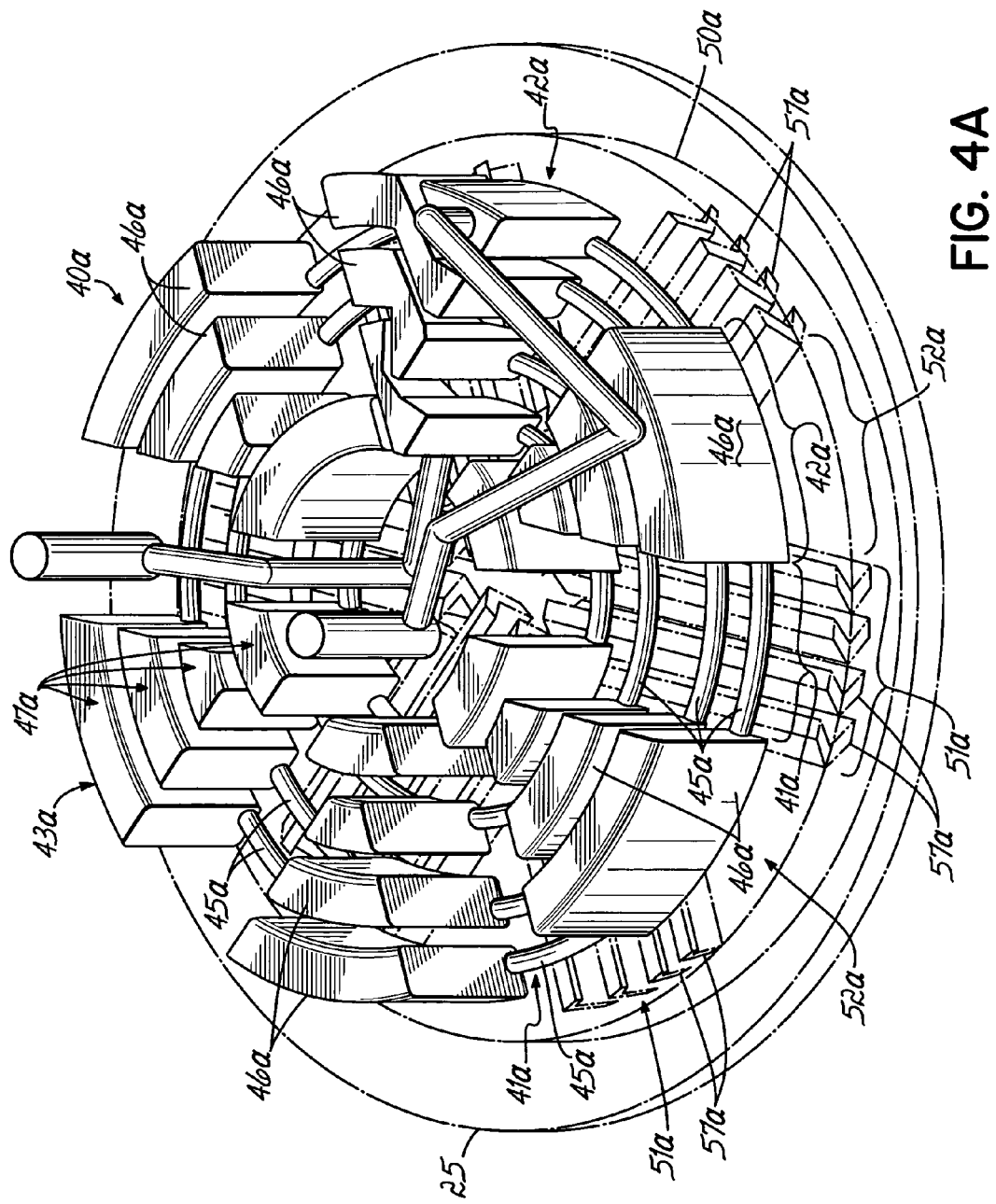
FIGS. 4A-4F are perspective diagrams of alternative embodiments of the ICP source of FIG. 4.

In FIG. 4A, the antenna 40a is depicted adjacent dielectric window 25. Baffle 50a is located on the opposite side of the window 25 from the antenna 40a. The antenna 40a is shown as formed of a continuous conductor 43a having four concentric loops 47a of six segments each when viewed from the top. A spiral band or a series of rings (not shown) of insulating material, for example of TEFLON, may be interposed between adjacent pairs of the windings 43a or others of the windings 43 in other embodiments. Each winding 47a has six small cross-section conductor segments 45a alternating with six large cross-section conductor segments 46a, with the segments 45a,46a of each winding aligning with similar segments of the adjacent winding 47a. The small cross-section windings 45a aligning radially to form radial wedge-shaped high-radiation efficiency portions 41a of the antenna 40a and the large cross-sections 46a aligning radially to form radial wedge-shaped low-radiation efficiency portions 42a of the antenna 40a.

The baffle 50a is shown as a circular metal member having six groups of chevron shaped slots 57a, which present no line-of-site paths through which particles could move in straight lines through the baffle from the plasma to the window 25. Each group of slots 57a defines an RF high-transparency portion 51a of the shield 50a. The slots 57a are oriented radially on the baffle 50a, perpendicular to the high-efficiency conductor segments 45a of the antenna 40a, to provide the high-transparency portion 51a of the baffle 50a. The areas between the six regions 51a are of solid metal and define the relatively opaque portions 52a of the baffle 50a, which align with the low-efficiency portions 46a of the conductor 43a.

To provide circumferential uniformity of the plasma, the fill-factor Φ and cross-section ration Θ are constant from section to section around the circumferences of each of the windings 47, but may differ from winding to winding.

Figure 4B:
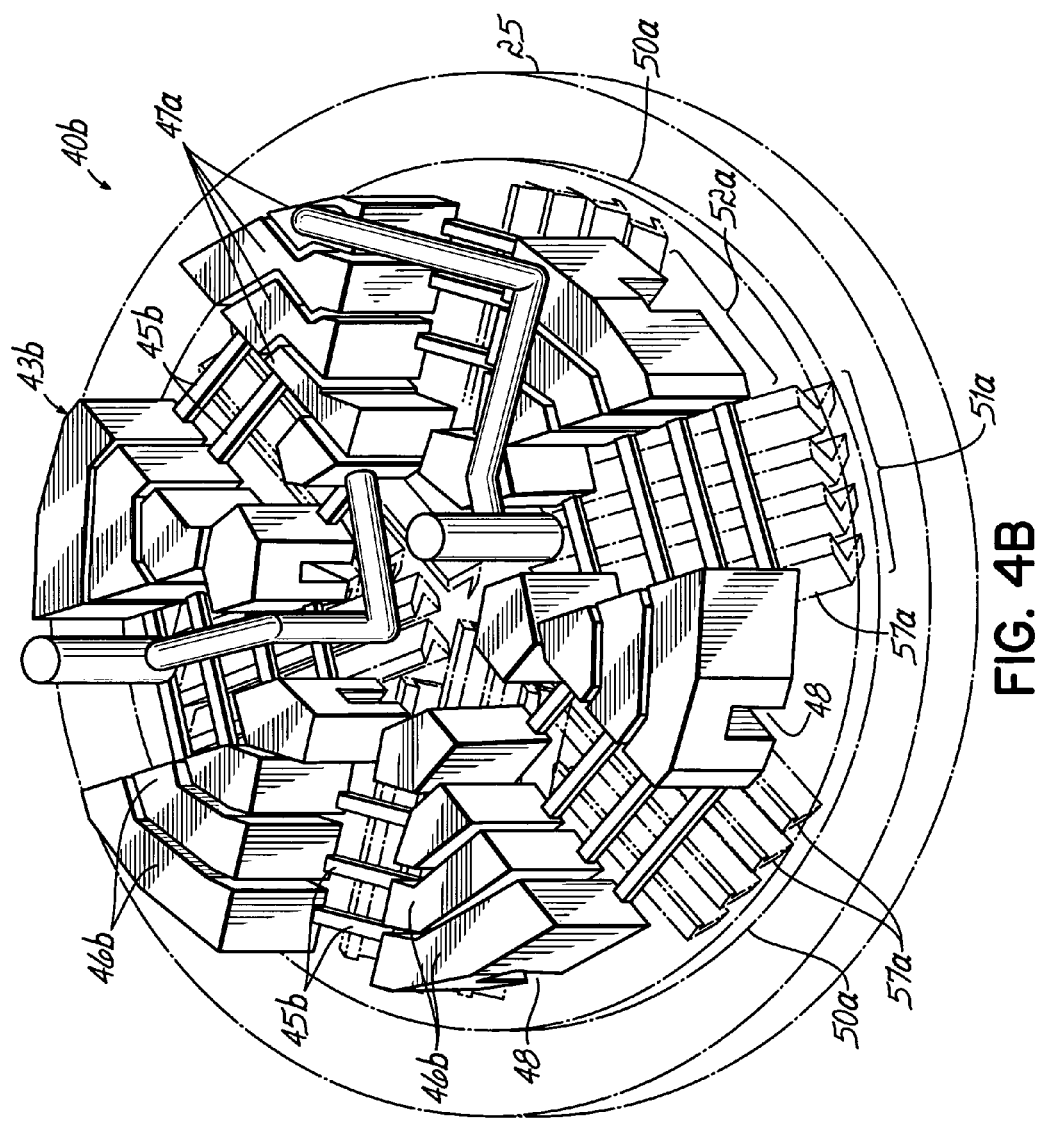
Figure 4C:
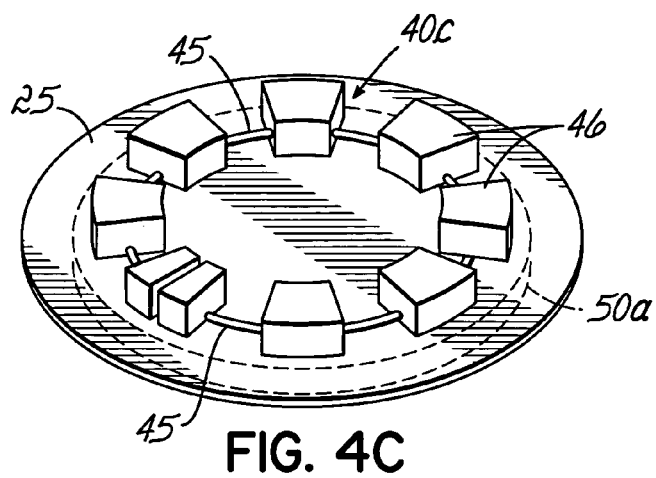
Figure 4D:
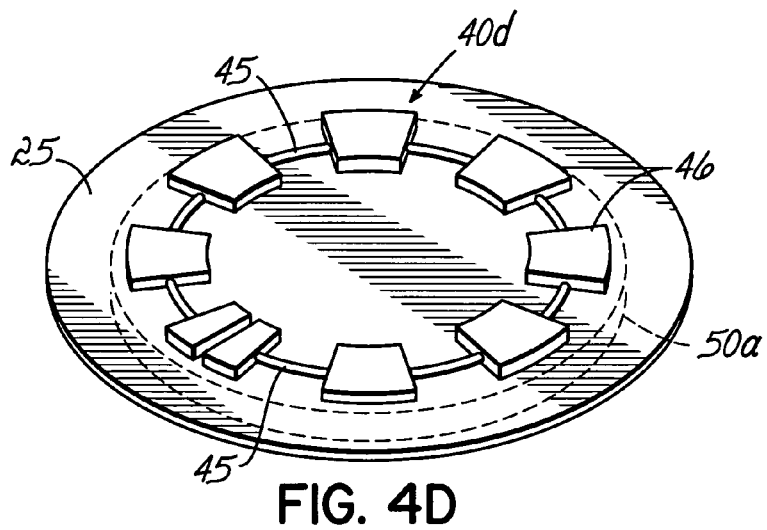
Figure 4E:
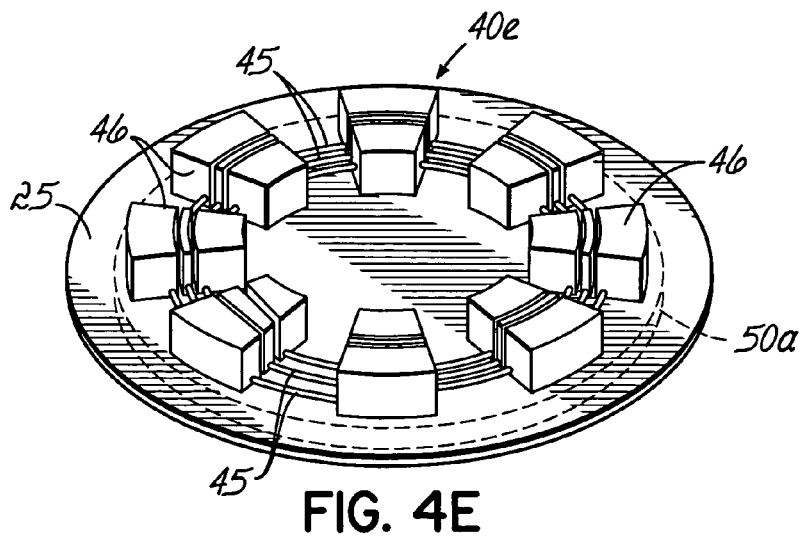

FIG. 4B illustrates a peripheral inductive element similar to that of FIG. 4A, but with an antenna 40b which has a conductor 43b with small and large cross-section segments 45b,46b formed in parallel straight segments, rather than the curved segments such as segments 45a,46a for antenna 40a. In addition, the antennas 40 may have arches or notches 48 in one surface of the large cross-section segments 46a, 46b to further reduce the inductance of these sections of the conductor 43a, 43b of the antennas 40. FIGS. 4C, 4D and 4E illustrate alternative antennas 40c, 40d and 40e, respectively, which each have eight radially spaced high and low-efficiency sections 45 and 46 of different configurations. The antennas 40c and 40d each have only one winding, while the antenna 40e has three.

Figure 4F:
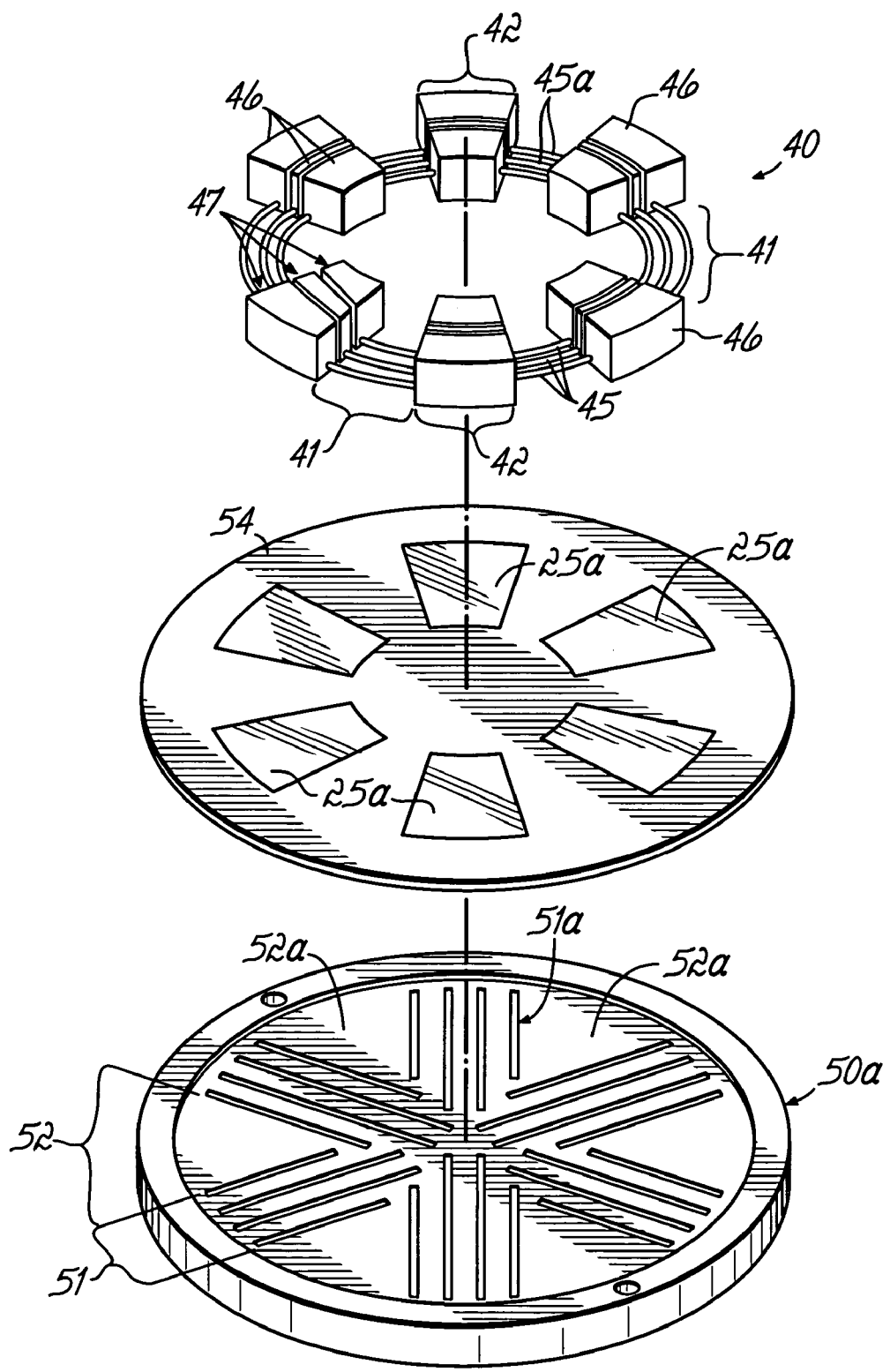

In the embodiments of FIGS. 4-4B, the window 25 can be rotated 30 degrees with respect to the aligned six-segment antennas 40a-40b and baffle 50a to double the mean-time-before-cleaning required for the window 25. Similarly, the window 25 can be rotated 22.5 degrees with respect to the aligned eight-segment antennas 40c-40e and corresponding eight-segment baffle (not shown). For large wafers 15 of 300 mm, such windows 25 must be fairly thick in order to withstand the force of atmospheric pressure. Such thick window 25 can be avoided by the use of an array of small window segments 25a, as illustrated in FIG. 4F. Such window segments 25a may be made wedge-shaped and positioned to align with the high-efficiency sections of the antenna 45a and the slotted high-transparency sections 51a of the shield 50a. Solid wall segments 54, between the window segments 25a, may align with the low-efficiency segments 46 of the antenna 40 and the low-transparency segments 52a of the shield 50a.

Figure 5:
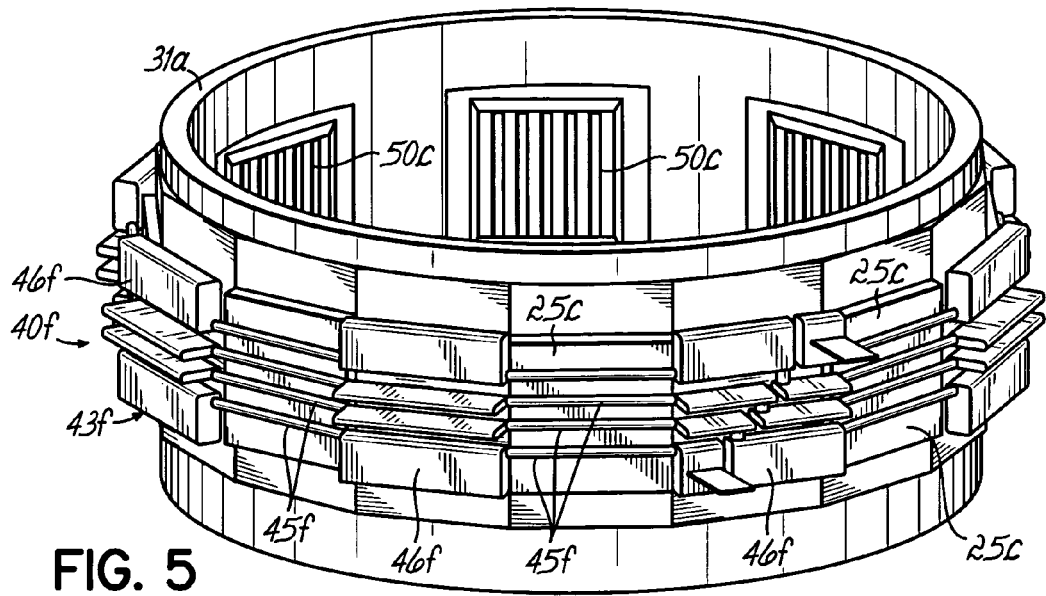
FIG. 5 is a diagrammatic perspective view of an ICP source for an etch apparatus according to an embodiment of the present invention.
Figure 5A:
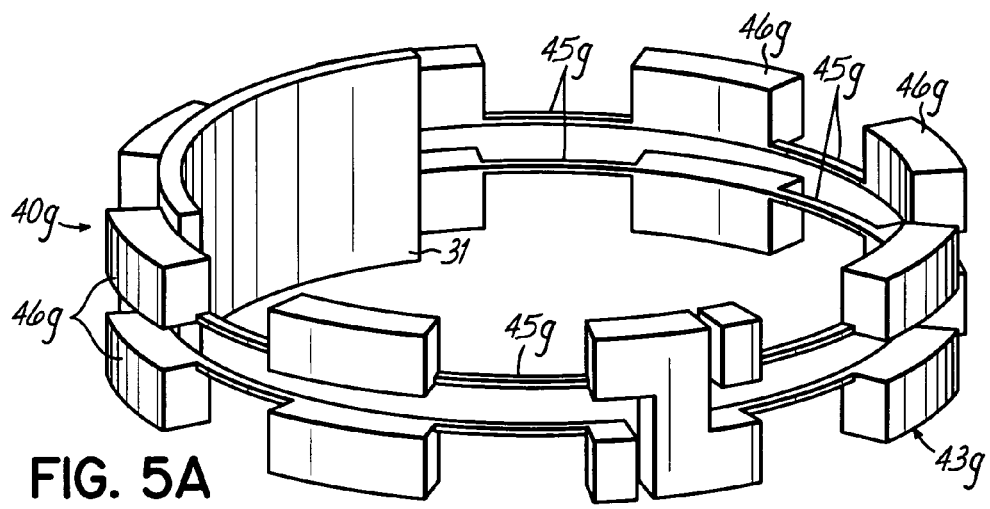
FIGS. 5A-5B are alternative antennas for the source of FIG. 5.
Figure 5B:
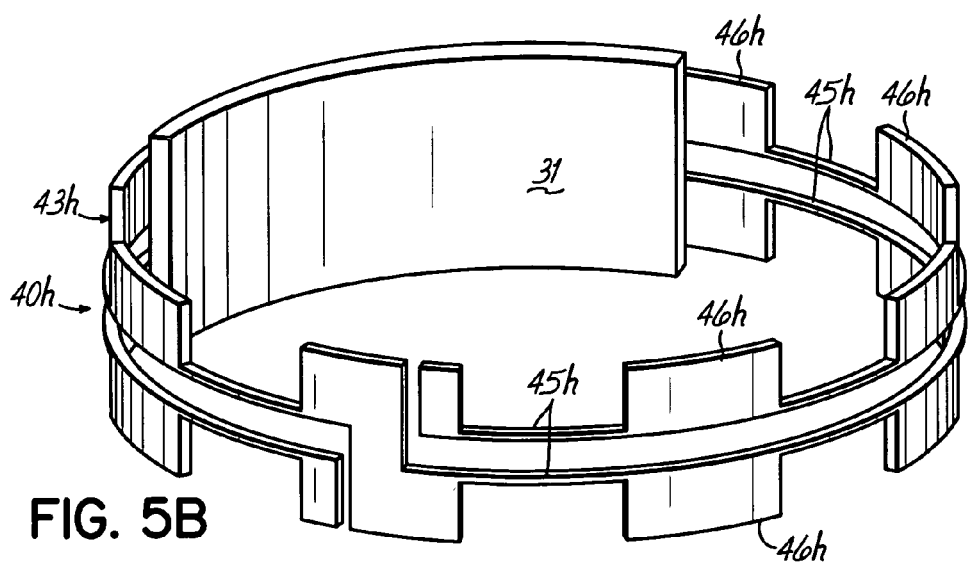

FIG. 5 illustrates a peripheral inductive element of a type suitable for an ICP etch module such as the etch apparatus 30 of FIG. 1A. In such an apparatus, the quartz chamber bell jar-shaped wall 31 may be replaced by a metal wall 31a having an array of small dielectric windows 25c therein, each covered by a correspondingly sized baffle 50c. A helical antenna 40f encircles the outside of the wall 31a, with high-efficiency, small conductor sections 45f aligning with the windows 25c and low-efficiency sections 46f aligning with the solid sections of the metal wall 31a between the window sections 25c. FIGS. 5A and 5B show alternative forms 40g, 40h, respectively, of the antenna 40f. Referring to FIGS. 5, 5A and 5B, such antennas 40f, 40g, 40h may be formed of a continuous conductor 43f,43g,43h, each having alternating high and low-efficiency sections, the high-efficiency, higher inductance sections 45f,45g,45h being formed of small cross-section conductors and the low-efficiency, lower inductance sections 46f,46g,46h being formed of large cross-section conductors. The apparatus in FIGS. 4A and 5B are shown with a solid bell jar-shaped window 31, as in FIG. 1A, in which case, rather than the individual shields 50c of FIG. 5, a cylindrical shield (not shown) would be provided with high-transparency sections aligned with the high-efficiency sections 45 of the antenna and low-transparency sections aligned with the low-efficiency sections 46 of the antennas 40.

An advantage of the conductors 43 described above that have the large and small cross-section portions is that the cooling of the antenna 50 need not be accomplished by providing hollow tubular conductors with cooling fluid flowing within. The large surface areas of the large cross-section portions of the conductor provide instead substantial thermal conductivity to provide ample cooling of the conductor by heat exchange with the surrounding medium.

Figure 6:
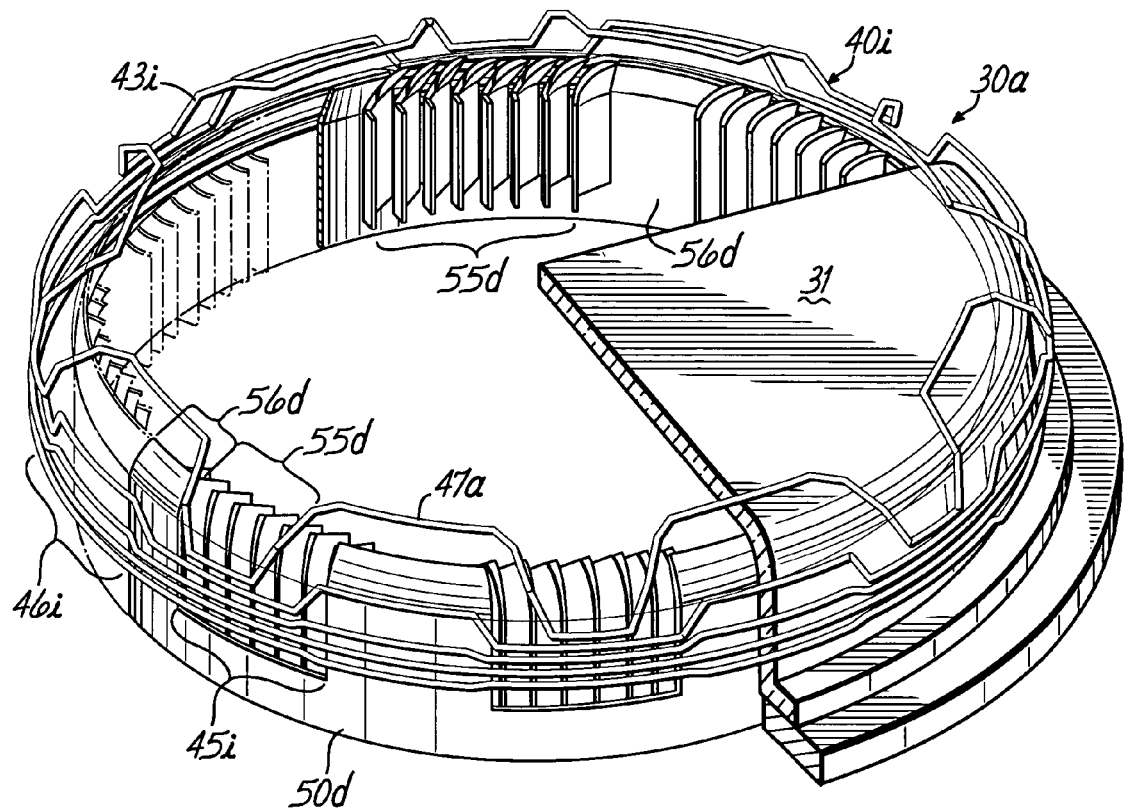
FIG. 6 is a diagrammatic perspective view of an ICP source for an etch apparatus similar to FIG. 5 according to another embodiment of the present invention.

FIG. 6 illustrates a cut-away portion of an etch module 30a similar to that of FIGS. 5-5B having a particularly cost-effective peripheral inductive element that can be manufactured using simple ICP source construction techniques. In FIG. 6, the dielectric wall 31 of the etch module 30a is surrounded by a modified helical antenna 40i that utilizes multiple windings of a conductor 43i formed of small size tubing throughout its length. The conductor 43i is configured to provide the advantages of the varying cross-section segmented antenna conductors 43 described above. A deposition shield 50d is provided on the inside of the bell jar-shaped dielectric wall 31. The shield 50d has high and low-transparency sections 55d,56d that respectively correspond to and radially align with high-efficiency sections 45i of the antenna 40i, in which the windings lie close together, and low-efficiency sections 46i of the antenna 40i, in which the windings are spread apart. The alternating closely-shaped or bundled conductors and spaced-apart or diverging conductor sections, 45i and 46i, respectively, of antenna 40i, have high and low-inductance and radiation efficiency, because the spreading of the conductors results in magnetic fields that oppose each other close to and between the individual conductor windings in the diverging sections 46i, while the closeness of the conductors results in magnetic fields that enforce each other by encircling the entire bundled conductor sections 45i.

In FIG. 6, the inductive element 43i is created by the tubular conductor 43i that is azimuthally divided into multiple sections, for example, eight sections, with the high and low-efficiency sections 45i, 46i each spanning 22.5 degrees. The pitch between individual loops is small in the high-efficiency, bundled-conductor sections 45i to generate locally stronger RF magnetic fields in the plasma. The pitch between individual loops is large in the low-efficiency, diverging-conductor sections 46i to generate reduced RF magnetic fields when passing through the dielectric wall.

The baffle 50d in the embodiment of FIG. 6 is generally cylindrical and surrounds the inside sidewall of the bell jar-shaped dielectric 31 directly opposite the antenna 40i, and generally protects the window from deposits around its cylindrical peripheral sidewall. The top portion of the dielectric 31 is not protected by the baffle 50d, but because the antenna does not rely on coupling through this portion, deposits on this portion do not interfere with the efficiency of the plasma generation. The high-transparency sections 55d, which align with the high-efficiency sections 45i of the antenna 40i, block all but minimal deposition on the dielectric 31, where the opaque sections 56d almost totally prevent deposits on the adjacent sections of the dielectric. Nonetheless, deposits of metal on the dielectric 31 adjacent the high-transparency sections 55d eventually begin to reduce RF coupling through the dielectric 50d at these portions. When this condition is reached, the antenna 40i can be rotated by 22.5 degrees to move the areas of accumulated deposits on the window 31 to double the mean-time-before-cleaning (MTBC) of the window.

The antenna 40i also has one of the windings, namely winding 47a, in the divergent sections 46i of the antenna 40i, extending partially around to the top side of the dielectric window 31, beyond the extent of the baffle 50d. Such extended windings 47a have a small capacitive coupling with the plasma and, as a result, are effective in coupling energy to the plasma during plasma ignition.

Figure 6A:
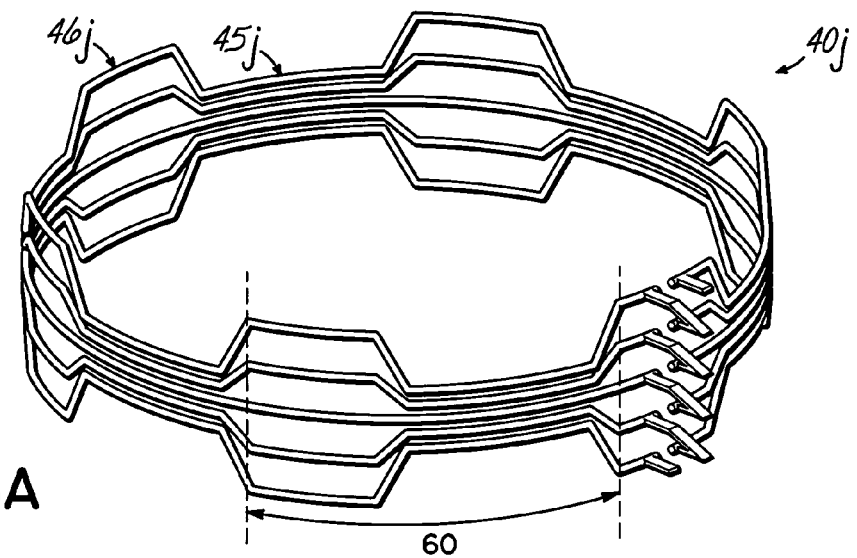
FIG. 6A is an alternative antenna for the source of FIGS. 5 and 6.
Figure 6D:
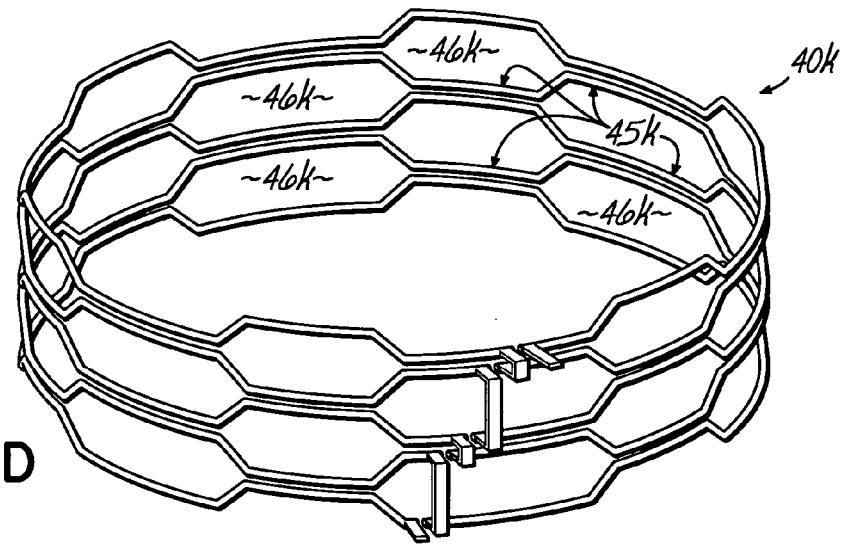
FIG. 6D is an alternative antenna for the source of FIGS. 5 and 6.
Figure 6G:
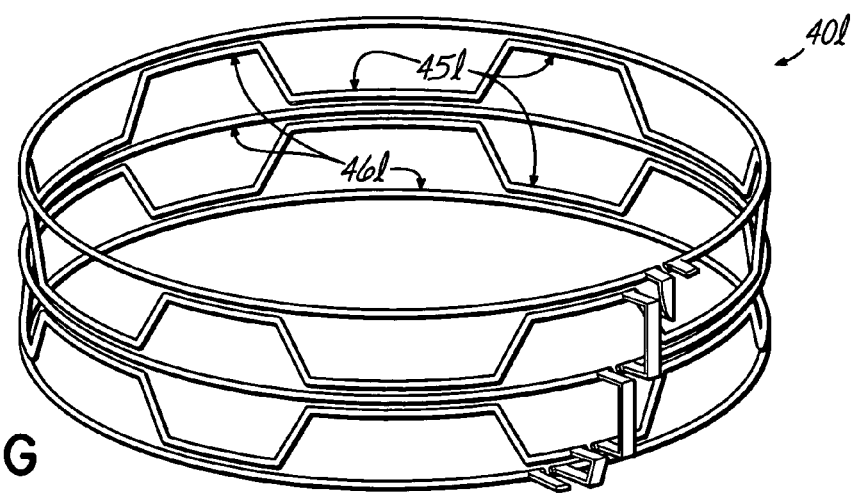
FIG. 6G is an alternative antenna for the source of FIGS. 5 and 6.
Figure 6B:
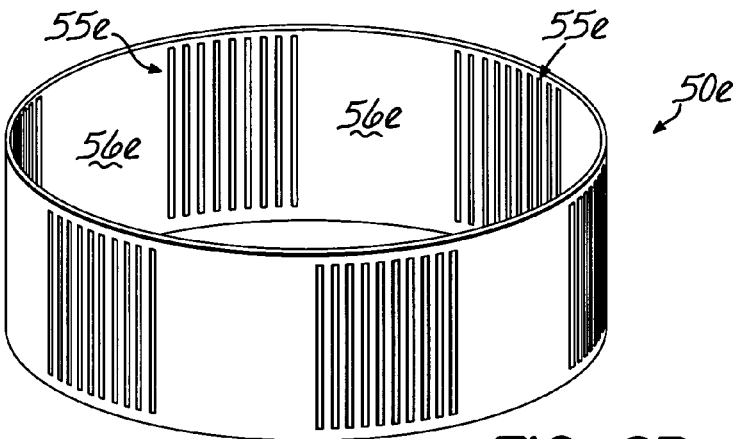
FIG. 6B is a deposition baffle for the antenna of FIG. 6A.

FIGS. 6A, 6D and 6G illustrate antennas 40j, 40k, and 40l, respectively, that are variations of the antenna 40i of FIG. 6, where the windings are configured in six alternating sections spanning 30 degrees each. The antenna 40j may be used, in place of the antennas 40f, 40g and 40h, with the shields similar to those of FIGS. 5, 5A and 5B or with the shield 50e of FIG. 6B, producing the energy distribution 60c of FIG. 6C. Peak power density is approximately up to 0.48 Wcm$^{-2}$ in regions 61c of FIG. 6F at 10 amp current through inductive element 40j, with little deposited power in regions 62c. Total deposited power into plasma is about 316 watts at these conditions.

Figure 6E:
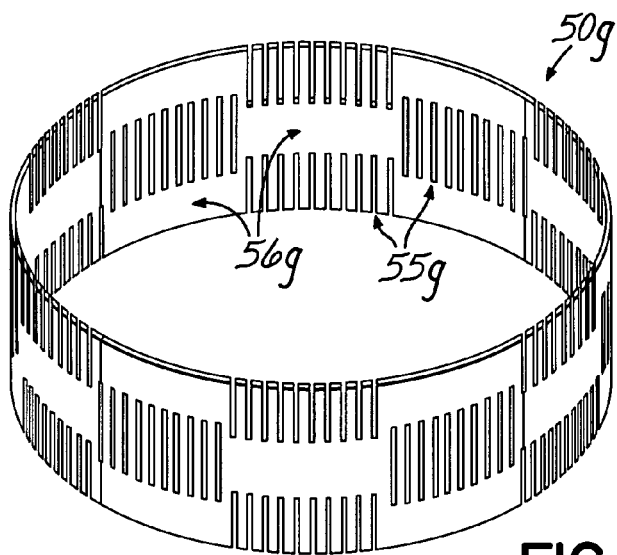
FIG. 6E is a deposition baffle for the antenna of FIG. 6D.
Figure 6H:
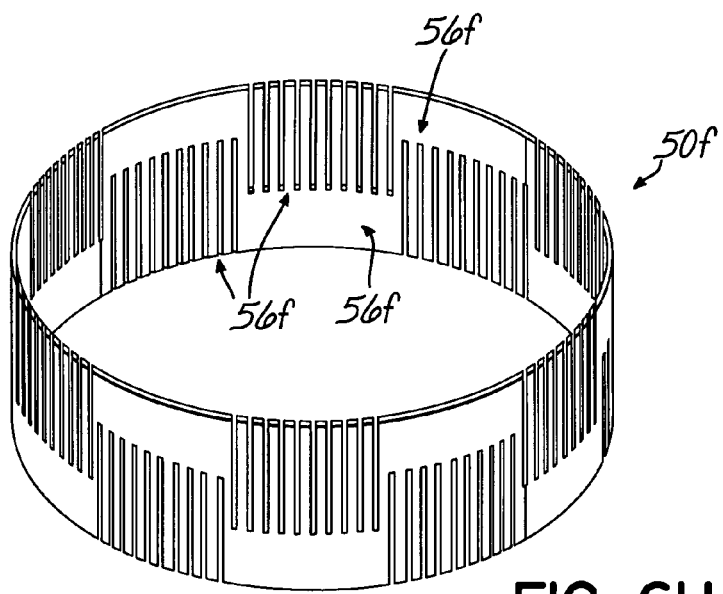
FIG. 6H is a deposition baffle for the antenna of FIG. 6G.
Figure 6C:
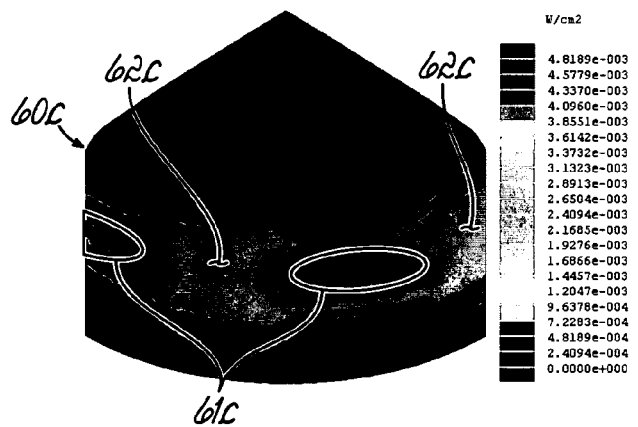
FIG. 6C is a power distribution diagram for an ICP source having the antenna of FIG. 6A and baffle of FIG. 6B.
Figure 6F:
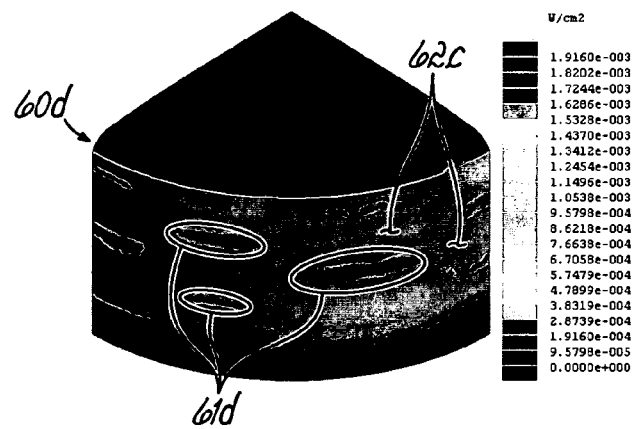
FIG. 6F is a power distribution diagram for an ICP source having the antenna of FIG. 6D and baffle of FIG. 6E.

Antennas 40k and 40l are configured in a honeycomb structure and may be used with the appropriate shields, including shields 50f and 50g, respectively, of FIGS. 6E and 6H, producing the energy distributions 60d and 60e of FIGS. 6F and 6G. The shield 50e has a single row of full-height alternating high-transparency and opaque sections 55e and 56e, respectively, to align with the high and low-efficiency sections 45j and 46j of the antenna 40j. Shield 50f has two staggered rows of alternating high-transparency and opaque sections 55f and 56f, respectively, to align with the high and low-efficiency sections 45k and 46k of the antenna 40k, while shield 50g has three staggered rows of alternating transparency and opaque sections 55g and 56g, respectively, to align with the high and low-efficiency sections 45l and 46l of the antenna 40l.

Figure 6J:
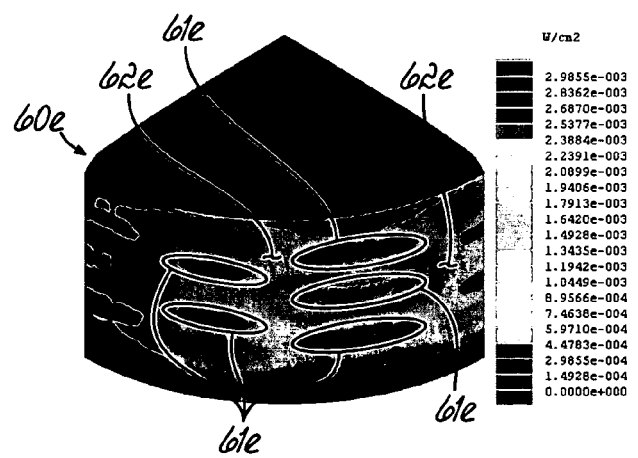
FIG. 6J is a power distribution diagram for an ICP source having the antenna of FIG. 6G and baffle of FIG. 6H.

For the honeycomb structure of the conductors within the antennas 40k, peak power density is approximately 0.19 Wcm$^{-2}$ in the regions 61d of FIG. 6F with little power deposited in the regions 62d. Total deposited power into plasma is approximately 220 watts. Inductance of the antenna 40k is less than for antenna 40j, e.g. 8.34 mH for antenna 40l versus 10.73 mH for antenna 40j. For antenna 40l, peak power density is 0.30 Wcm$^{-2}$ in regions 61e of FIG. 6J with little deposited power in regions 62e. Total power is 235 watts at 10 amps, 450 kHz, with inductance at 8.59 mH.

The deposition shields 50e, 50f and 50g of FIGS. 6B, 6E and 6H have the high-transparency portions 55e, 55f and 55g adjacent the areas of reduced pitch of the respective antennas 40j, 40k and 40l.

Figure 7A:
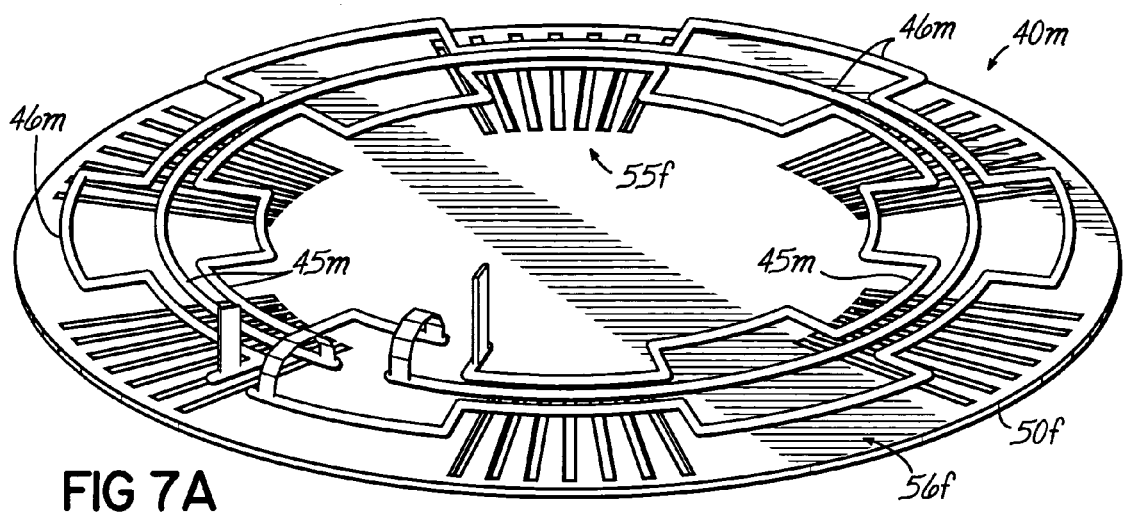
FIGS. 7A-7C are perspective diagrams of alternative ICP sources for the iPVD apparatus cathode assembly of FIG. 4.
Figure 7B:
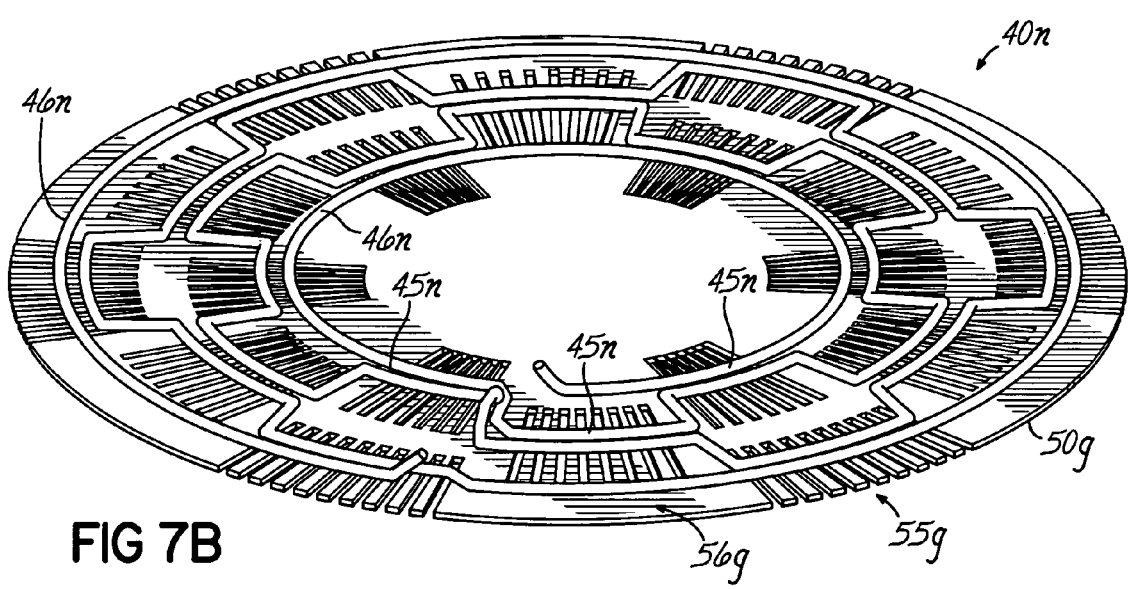

FIGS. 7A and 7B illustrate cost effective embodiments 40m and 40n of antennas suitable for an iPVD application as illustrated in FIG. 4. The antennas 40m and 40n each have high-efficiency sections 45m, 45n and low-efficiency sections 46m, 46n, each having constant cross-section tubular conductors with modulated pitch structure. Deposition baffles 50f and 50g are designed for use with antennas 45m and 45n, respectively, and have sections of high-transparency, 55f, 55g and opacity 56f, 56g, configured and aligned with the antenna sections according to the principles described above.

Figure 7C:
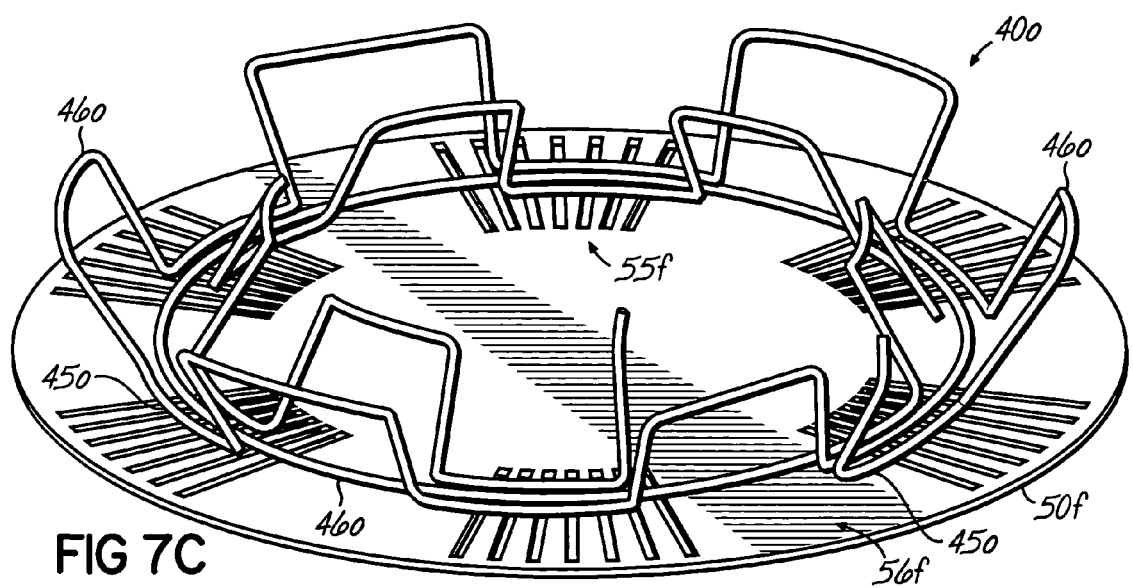

Antenna 40o of FIG. 7C is a preferred three-dimensional embodiment of an antenna that can be efficiently used with the baffle 50f (FIG. 7A). It includes six 30 degree sections 45o of closely-spaced conductors alternating with six 30 degree sections 46o of diverging conductors that extend away from the plane of the shield 50f. The concentrated high-efficiency sections 45o of the antenna 40o align with the high-transparency sections 55f of the shield 50f while the divergent low efficiency sections of the antenna 40o align with the opaque sections 56f of the shield 50f.

Advantages and benefits of the disclosed configurations include doubling of the lifetime of dielectric bell jar of FIG. 6 or window 25 of FIG. 4, by rotation of the dielectric, taking advantage of only a portion of the window being directly exposed to plasma and contamination. With these and other embodiments described above, ohmic losses into deposition shield 500 are less than with the prior art. Reliable plasma ignition is provided, particularly with the configuration of FIG. 6, by extending the winding 47a of the antenna 40i that extends beyond the shield 50d, where it can capacitively couple energy through the window to ignite the plasma. Partially opaque deposition shields can be used without losing power due to reduced inductive coupling. RF power deposition into the plasma is increased in pre-selected locations, which can be tailored by inductive element design by varying antenna pitch value of the antenna sections and the ratio between "low" and "high" transmission areas of the deposition shield. Intense RF magnetic fields are generated locally, increasing deposited power into the plasma even through slots in the deposition shield that are relatively short. Little RF power is lost in the opaque shield areas.

The invention has been described in the context of exemplary embodiments. Those skilled in the art will appreciate that additions, deletions and modifications to the features described herein may be made without departing from the principles of the present invention. Accordingly, the following is claimed:

The invention claimed is:

1. An ICP source for producing a high-density inductively coupled plasma in a vacuum chamber for the plasma processing of a semiconductor wafer therein, the source comprising:
   a dielectric chamber wall having a vacuum side and an atmospheric side and formed of at least one section of dielectric material;
   a peripheral ionization source including an RF antenna on the atmospheric side of the dielectric chamber wall and a shield on the vacuum side of the dielectric chamber wall;
   the peripheral ionization source having a segmented configuration of alternating high-radiation and low-radiation segments arranged in a ring and positioned to couple power through the dielectric chamber wall into the chamber to produce a plasma having an annular, alternating, high and low power distribution;
   the shield having alternating high-transparency and low-transparency sections arranged in a ring and positioned relative to the antenna to facilitate the coupling of RF energy from the antenna through the dielectric chamber wall and the shield and into the chamber in the annular, alternating, high and low power distribution, the high-radiation segments including the high-transparency sections of the shield and the low-radiation segments including the low-transparency sections of the shield; and
   the high-transparency sections of the shield each having a plurality of slots therethrough oriented relative to the antenna to facilitate the inductive coupling through the high-transparency sections, and the low-transparency sections of the shield being solid electrically conductive sections with no slots to impede inductive coupling there-through;
   the RF antenna has a segmented configuration arranged in a ring that includes high-efficiency sections formed of small cross-section conductors that provide concentrated antenna current paths close to the dielectric chamber wall and low-efficiency sections formed of relatively large cross-section conductors that provide distributed antenna current paths, whereby stronger magnetic fields are produced adjacent the high-efficiency sections of the conductor than adjacent the low-efficiency sections of the conductor; and
   the high-efficiency sections of the antenna are aligned with the high-transparency sections of the shield to form the high-radiation segments of the peripheral ionization source and the low-efficiency sections of the antenna are aligned with the low-transparency sections of the shield and form the low-radiation segments of the peripheral ionization source.

2. The ICP source of claim 1 wherein:
   the dielectric chamber wall includes a plurality of discrete pieces of dielectric material, one within each of the high-radiation segments of the peripheral ionization source between and aligned with a high-efficiency section of the antenna and a high-transparency section of the shield.

3. An iPVD apparatus having the source of claim 2.

4. A plasma etch apparatus having the ICP source of claim 3.

5. The ICP source of claim 1 wherein:
   the shield is flat and circular, the high-transparency sections of the shield have a plurality of radially extending slots therethrough, and the low-transparency sections of the shield are solid.

6. An iPVD apparatus having the ICP source of claim 1.

7. A plasma etch apparatus having the ICP source of claim 1.

8. The ICP source of claim 7 wherein:
   the high-efficiency sections of the antenna provide concentrated antenna current paths close to the dielectric chamber wall and the low-efficiency sections provide distributed antenna current paths.

9. The ICP source of claim 1 wherein:
   the antenna has a configuration segmented in such a way to lower its total inductance, the configuration being formed of at least one conductor having a plurality of windings each having alternating high-efficiency and low-efficiency sections each respectively aligned with the alternating high-efficiency and low efficiency sections of an adjacent winding and the alternating high-transparency and low-transparency sections of the shield to respectively produce the alternating high-radiation and low-radiation segments of the peripheral ionization source;
   the alternating segments of the peripheral ionization source being arranged in a ring and positioned to couple power through the dielectric chamber wall and into the chamber in the annular alternating high and low power distribution.

10. The ICP source of claim 1 wherein:
    the dielectric chamber wall includes a plurality of discrete pieces of dielectric material, one within each of the high-radiation segments of the peripheral ionization source.

11. A semiconductor wafer processing apparatus having the source of claim 1.

* * * * *

UNITED STATES PATENT AND TRADEMARK OFFICE
CERTIFICATE OF CORRECTION

PATENT NO. : 7,273,533 B2
APPLICATION NO. : 10/717268
DATED : September 25, 2007
INVENTOR(S) : Brcka et al.

It is certified that error appears in the above-identified patent and that said Letters Patent is hereby corrected as shown below:

Title Page, (56) under the "References Cited" section, "6,685,799 B2* 2/2004 Hooshdaran et al." should read --6,685,799 B2* 2/2004 Davis et al.--.
Col. 2, line 31, "torroids," should read --toroids,--.
Col. 2, line 35, "by the present applicant" should read --by the present applicants--.
Col. 2, line 39, "are becoming of increase demand" should read --are becoming of increased demand--.
Col. 2, line 51, "processing of 300 mm wafer." should read --processing of 300 mm wafers.--.
Col. 5, line 4, "low flux channels, are" should read --low flux channels are--.
Col. 8, line 23, "Applicant has proposed" should read --Applicants have proposed--.
Col. 10, line 3, "of the rf power deposited into" should read --of the RF power deposited into--.
Col. 10, line 45, "(FIG. 2O and 2F)" should read --(FIGS. 2D and 2F)--.

Signed and Sealed this

Eleventh Day of November, 2008

JON W. DUDAS
*Director of the United States Patent and Trademark Office*